US008201258B2

(12) United States Patent
Cherpantier

(10) Patent No.: US 8,201,258 B2
(45) Date of Patent: Jun. 12, 2012

(54) SECURE PERSONALIZATION OF MEMORY-BASED ELECTRONIC DEVICES

(75) Inventor: Fredric Cherpantier, Rueil Malmaison (FR)

(73) Assignee: Spansion LLC, Sunnyvale, CA (US)

( * ) Notice: Subject to any disclaimer, the term of this patent is extended or adjusted under 35 U.S.C. 154(b) by 1011 days.

(21) Appl. No.: 11/874,036

(22) Filed: Oct. 17, 2007

(65) Prior Publication Data
US 2009/0106483 A1    Apr. 23, 2009

(51) Int. Cl.
*H04L 29/06* (2006.01)
*G06F 7/04* (2006.01)
*G06F 17/30* (2006.01)
*G06F 21/00* (2006.01)
*H04N 7/16* (2011.01)
*G06K 5/00* (2006.01)

(52) U.S. Cl. .................. 726/26; 726/2; 726/15; 726/20; 726/28; 235/380; 713/182

(58) Field of Classification Search ......................... None
See application file for complete search history.

(56) References Cited

U.S. PATENT DOCUMENTS

| 6,003,134 | A  | * | 12/1999 | Kuo et al. ......................... 726/20 |
| 6,402,028 | B1 | * | 6/2002  | Graham et al. ................ 235/380 |
| 7,152,230 | B2 | * | 12/2006 | Sato et al. ...................... 717/178 |
| 7,299,203 | B1 | * | 11/2007 | Nelson ............................. 705/28 |
| 2002/0040438 | A1 | * | 4/2002 | Fisher, Jr. ....................... 713/200 |
| 2003/0074611 | A1 | * | 4/2003 | Nachumovsky ............... 714/718 |
| 2003/0111528 | A1 | * | 6/2003 | Sato et al. ...................... 235/380 |
| 2003/0189092 | A1 | * | 10/2003 | Takano .......................... 235/380 |
| 2006/0053297 | A1 | * | 3/2006 | Huang et al. .................. 713/182 |
| 2006/0168702 | A1 | * | 7/2006 | Bretschneider ................. 902/26 |
| 2007/0247937 | A1 | * | 10/2007 | Moriyama et al. ............. 365/200 |
| 2008/0005559 | A1 | * | 1/2008 | Johnson .......................... 713/159 |
| 2008/0022364 | A1 | * | 1/2008 | Oikawa et al. ..................... 726/2 |

* cited by examiner

*Primary Examiner* — Shin-Hon Chen
(74) *Attorney, Agent, or Firm* — Turocy & Watson, LLP

(57) ABSTRACT

Systems and/or methods that facilitate programming content to a plurality of nonvolatile memory devices are presented. A wafer program component facilitates programming content to a plurality of memory devices contained on a wafer. The wafer program component can interface with the wafer and can employ parallel processes to program the memory devices on the wafer at substantially the same time. The content programmed to the memory devices can be the same content or different content. A portion of the content can be access-restricted where authentication information is to be provided in order to be granted access to such content, where access-restricted content can include content associated with subscriptions or personal information of a user(s).

19 Claims, 14 Drawing Sheets

SECURE PERSONALIZATION OF MEMORY-BASED ELECTRONIC DEVICES

TECHNICAL FIELD

The subject specification relates generally to memory systems and in particular to systems and/or methodologies that can facilitate programming and storing information in memory devices.

BACKGROUND

Integrated circuits (IC) can be fabricated on wafers. A wafer can be a thin slice of semiconductor material (e.g., silicon and germanium) on which ICs can be created using diffusion or ion implantation methods, for example. A wafer can range from one inch to twelve inches in diameter and can contain hundreds of individual ICs.

During semiconductor device fabrication, wafer testing can be performed. Generally, the ICs are tested for defects while they are still on the wafer, for example, prior to being cut into individual dies. During this step, all individual integrated circuits that are present on the wafer can be tested for functional defects by applying specified test patterns to them. The wafer testing can be performed by a piece of test equipment called a wafer prober, for example.

During testing, a wafer prober can generate test patterns and send the patterns to the individual ICs to stimulate the design. Each of the ICs in turn can generate a corresponding output based on the input. The generated output can then be compared to an expected result. If the generated output of a particular IC does not match the expected result, then it can be determined that an error has occurred and the IC that generated the error can be noted as potentially defective on a wafermap. Some of these defects can be repaired because ICs often can be designed with internal spare resources (e.g., extra address lines in flash memory). For example, a wafer can be comprised of a plurality of ICs that each can include memory components (e.g., flash memory). The ICs, including the respective memory components thereon, can be tested prior to the wafer being cut into individual IC chips.

Conventionally, after the memory components are installed into respective packages (e.g., electronic device such as cellular phone, smart card, personal digital assistant (PDA), etc.), content, such as applications, personalized data, etc. can be programmed into the respective memory components prior to providing the packages to the end user. Programming each memory device in such conventional manner can be time consuming as each memory component must be connected to a source that can program the content to the memory component.

It is desirable to be able to expeditiously and efficiently program and store content (e.g., applications, personalized information) to memory components during the fabrication process, as this can result in higher productivity and lower manufacturing cost.

SUMMARY

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

The disclosed subject matter relates to systems and/or methods that can facilitate programming personalized data into memory devices that can be comprised of integrated circuits (IC) while the memory devices are contained on the wafer. In accordance with one aspect of the disclosed subject matter, a wafer program component can be employed to facilitate programming content (e.g., applications, secure personalized information, etc.) to a plurality of memory devices that can be included within respective memory modules, and which can be comprised of ICs, while the memory modules are contained on a wafer. After the memory devices are programmed with the desired content, the wafer can then be cut or diced such that each of the memory devices can be a physically distinct structure, and the memory devices can be installed into a respective electronic device (e.g., cellular phone, personal digital assistant (PDA), smart card, etc.) that can be utilized by an end user. The wafer program component can be associated with and/or connected to the wafer and can employ parallel processes that can facilitate programming desired content to the plurality of memory devices on the wafer such that the memory devices can be programmed at the same time, or at substantially the same time.

In accordance with another aspect of the disclosed subject matter, individual or customized subsets of content can be programmed to each respective memory device during the manufacturing process while the memory devices are contained on an uncut wafer. In accordance with still another aspect, the wafer program component can be employed to facilitate programming identical content into the memory devices. A subset of the content can be programmed and stored on the memory devices in a secure manner such that a user of the electronic device in which a memory device is utilized can only access the subset of content by subscribing to the service or application associated with the subset of content. Upon subscribing to the service or application, authentication information (e.g., personal identification number, passcode, key to decrypt the information, etc.) can be provided to the user, and the user can utilize the authentication information to access the content associated with the subscription(s).

In accordance with yet another aspect of the disclosed subject matter, the wafer program component can retrieve a subset of content from an information database based on a type of end-user electronic device and/or user characteristics. The wafer program component can access information from the information database, can analyze the information, and can sort the information based on a set of criteria. For example, the wafer program component can determine the type of electronic device in which the memory devices are to be utilized and/or the type of content desired by a particular user. The wafer program component can read data from an information database and can determine what type of data (e.g., personal information, MP3's, and other types of media) is to be programmed to and/or stored in the plurality of memory devices (e.g., within respective memory modules) located on the wafer based on the type of electronic device (e.g., cellular phone, PDA, smart card, etc.) in which the memory device will be installed and/or the content desired by the end user.

The following description and the annexed drawings set forth in detail certain illustrative aspects of the disclosed subject matter. These aspects are indicative, however, of but a few of the various ways in which the principles of the innovation may be employed and the disclosed subject matter is intended to include all such aspects and their equivalents.

Other advantages and distinctive features of the disclosed subject matter will become apparent from the following detailed description of the innovation when considered in conjunction with the drawings.

DETAILED DESCRIPTION

Figure 1:
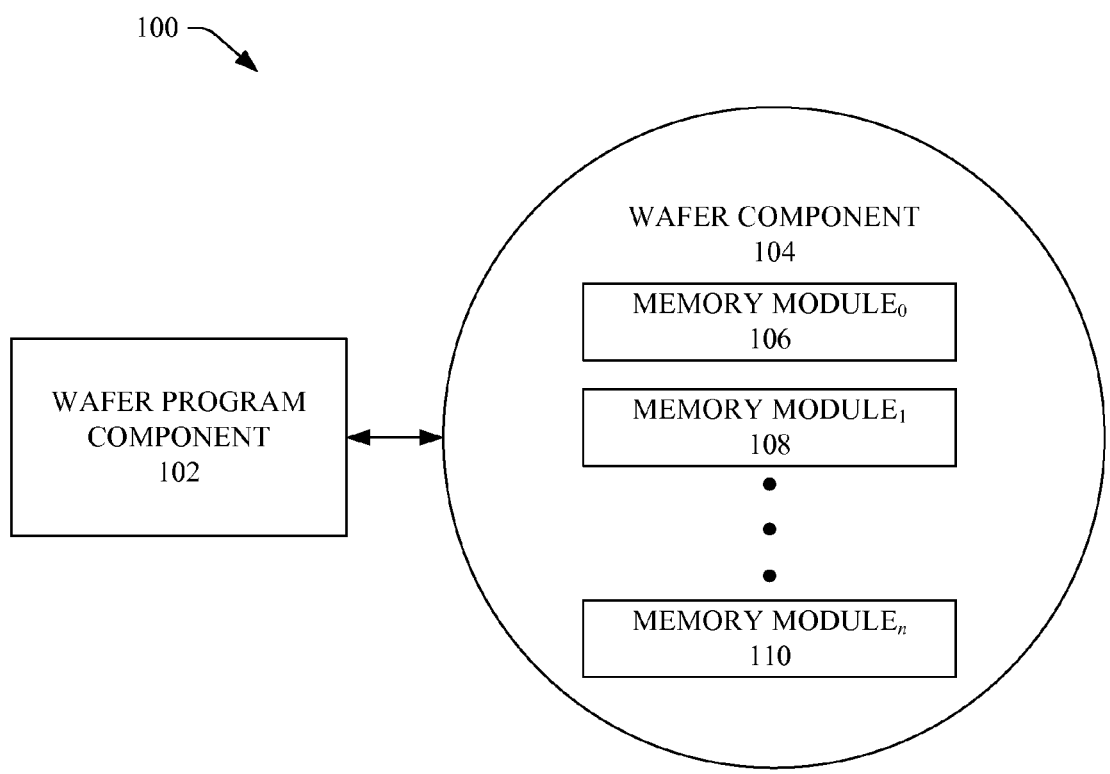
FIG. 1 illustrates a block diagram of a system that programs data to memory devices on a wafer in accordance with an aspect of the subject matter disclosed herein.

The disclosed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram form in order to facilitate describing the subject innovation.

Conventionally, during fabrication, memory devices and other types of semiconductor devices on a wafer can be tested to ensure the memory devices and other individual semiconductor devices are working properly. The individual semiconductor devices (e.g., such as the memory devices) can be interconnected by a common bus that also can be available for external connections to the semiconductor wafer, which can allow test equipment to electronically connect to the individual semiconductor devices.

Typically, the test patterns generated for testing the individual components are not in the form of a program or end-user information, and it is typically not necessary for any portion of the test patterns to reside with the semiconductor devices (e.g., the memory devices) after fabrication. Conventionally, memory devices on a wafer are cut or diced into individual dies that can be installed into various types of electronic devices, and such memory devices are then programmed with content (e.g., operating system, applications, other data).

Systems and/or methods are presented that can facilitate programming memory devices contained on a wafer with data prior to the memory devices being cut into individual dies. A wafer program component can be connected to a wafer that contains a plurality of memory modules that can each include a memory device. The wafer component can program data to the memory devices in parallel to efficiently program all the memory devices on the wafer at the same time, or substantially the same time. The data programmed and stored in the memory devices can include, for example, operating system code supplied by manufactures to facilitate proper functioning of end-user electronic devices, applications, and/or user-related code such as, for example, audio and/or video files, bank account information, and/or other personalized information. The type(s) of data (e.g., content) to be stored in respective memory devices can be determined based on pre-defined program criteria, such as, the type of device being programmed, the size of memory available, user characteristics, specialized end-user information, or any combination thereof, for example. Further, certain restricted content can be programmed to the memory devices such that a user cannot access the restricted content without providing authentication information (e.g., password) associated with the particular restricted content. The restricted content can be made available to the user on a subscription basis, where the user can subscribe to gain access to such restricted content and can be provided authentication information. The user can provide (e.g., input) the authentication information to the electronic device to gain access to the restricted content stored in the memory of the electronic device.

Turning to FIG. 1, illustrated is a system 100 that can facilitate programming data into a plurality of memory devices (e.g., in respective memory modules) in accordance with the disclosed subject matter. System 100 can include a wafer program component 102 that can facilitate programming the memory devices (not shown). The memory devices can be located on a wafer component 104. For example, wafer component 104 can be comprised of a plurality of memory modules, such as n memory modules, memory module$_0$ 106, memory module$_1$ 108, up through memory module$_n$ 110 (hereinafter referred to collectively as "memory modules 106, 108, 110"). Each of the memory modules 106, 108, and 110 can include a memory device (e.g., non-volatile memory, such as flash memory). The wafer program component 102 can program data (e.g., content) to each of the memory devices in the respective memory modules (e.g., 106, 108, 110) based on predefined program criteria, such as, for example, the type of electronic device in which the memory module(s) are to be utilized, characteristics of the end user who will use the electronic device, etc.

In accordance of one aspect of the disclosed subject matter the wafer program component 102 can be comprised of one or more computers (not shown) comprised of hardware, software (e.g., in execution), and/or firmware, such as, for example, the computer system described in system 1300. The computer(s) can facilitate determining the type of content to be programmed to plurality of memory devices contained on the wafer component 104 and/or the programming of such content to the memory devices.

In accordance of another aspect of the disclosed subject matter, the wafer program component 102 can facilitate determining the type of content that can be selected (e.g., via a computer, for example) to be programmed and stored into each of the plurality of memory devices in respective memory modules (e.g., 106, 108, 110) based on the type of electronic device in which the memory modules 106, 108, 110 utilized and/or the end user of the electronic device. The wafer program component 102 can associate or can receive information that can associate a subset of content (e.g., operating system (s), application(s), audio files, video files, etc.) with an end user and/or type of electronic device (e.g., cell phone, PDA) in which the data content can be stored. The wafer program component 102 can select and/or retrieve a subset of content from a content database, where the subset of content can be content that is associated with and/or corresponds with the type of electronic device and/or the end user (e.g., user characteristics), and can program the subset of content to each of the plurality of memory devices within respective memory modules 106 through 110 contained on the wafer component 104.

In accordance with another aspect, the wafer program component 102 can determine a subset of content that can be programmed into one or more of the memory devices in respective memory modules 106 through 110 based on the type of electronic device that is to contain the memory device and/or the end user of the electronic device. When the same subset of content is to be programmed into the plurality of memory devices in memory modules 106 through 110 on the wafer component 104, the wafer program component 102 can create a specified or predetermined "memory stamp(s)" that can be associated with the memory devices in the memory modules 106 through 110 located on the wafer component 104 and/or an electronic device(s) in which such memory devices can be installed. The memory stamp can include and/or can be associated with a particular subset of content, where such subset of content can be based on the type of electronic device and/or end user associated therewith. The wafer program component 102 can facilitate the use of memory saving techniques to store each memory stamp into a storage device (e.g., memory, magnetic tape, hard disc, etc.). During programming, the wafer program component 102 can retrieve the desired memory stamp, including the associated subset of content. Employing parallel processes, the wafer program component 102 can simultaneously, or substantially simultaneously, program the subset of content associated with the memory stamp to the plurality of memory devices within respective memory modules 106 through 110 on the wafer component 104.

In accordance with another aspect, the wafer program component 102 can determine disparate subsets of content that can be programmed, respectively, into one or more of the memory devices within respective memory modules 106 through 110 based on the type of electronic device that is to contain the respective memory device and/or the end user of the electronic device. The respective subsets of content can be based on specific user information (e.g., personalized information) such as for example, identification information, bank account information, credit card information, home address information, desired audio or video files, etc. Each of the disparate subsets of content can be programmed into respective memory devices in memory modules 106 through 110 contained on the wafer component 104 in parallel to facilitate efficient programming of the memory devices. Each of the respective memory modules 106 through 110 can be cut into individual dies after programming and can be installed in the corresponding electronic device associated with a respective end user.

In one aspect the wafer program component 102 can program the disparate subsets of content to respective memory devices in parallel to facilitate efficient programming of the memory devices. In another aspect, the wafer program component 102 can program portions of the disparate subsets of content in parallel to facilitate efficient programming of the memory devices. For example, if a certain number of memory devices on the wafer component 104 are to have the same operating system and the same applications, but different audio files, the wafer program component 102 can program the operating system and applications into each of those memory devices in parallel so that such content is programmed to the memory devices at the same time, or substantially the same time. The disparate sets of audio files can be programmed to respective memory devices, where such audio files can be programmed to the memory devices in parallel or can be programmed to the memory devices individually.

In still another aspect of the disclosed subject matter, the wafer program component 102 can program a subset of content that can have restricted access. The restricted subset of content can include personal information (e.g., bank account information, credit card information, identification information, etc.) and/or subscription-based content (e.g., music files, video files, applications, etc.), where the user of the electronic device can only gain access to the restricted subset(s) of content by presenting (e.g., inputting) valid authentication data associated with the respective subset of content to the memory device within the electronic device. The authentication data can be in the form of a password (e.g., a sequence of humanly cognizable characters), a pass phrase (e.g., a sequence of alphanumeric characters that can be similar to a typical password but is conventionally of greater length and contains non-humanly cognizable characters in addition to humanly cognizable characters), a pass code (e.g., Personal Identification Number (PIN)), and the like, for example.

Figure 2:
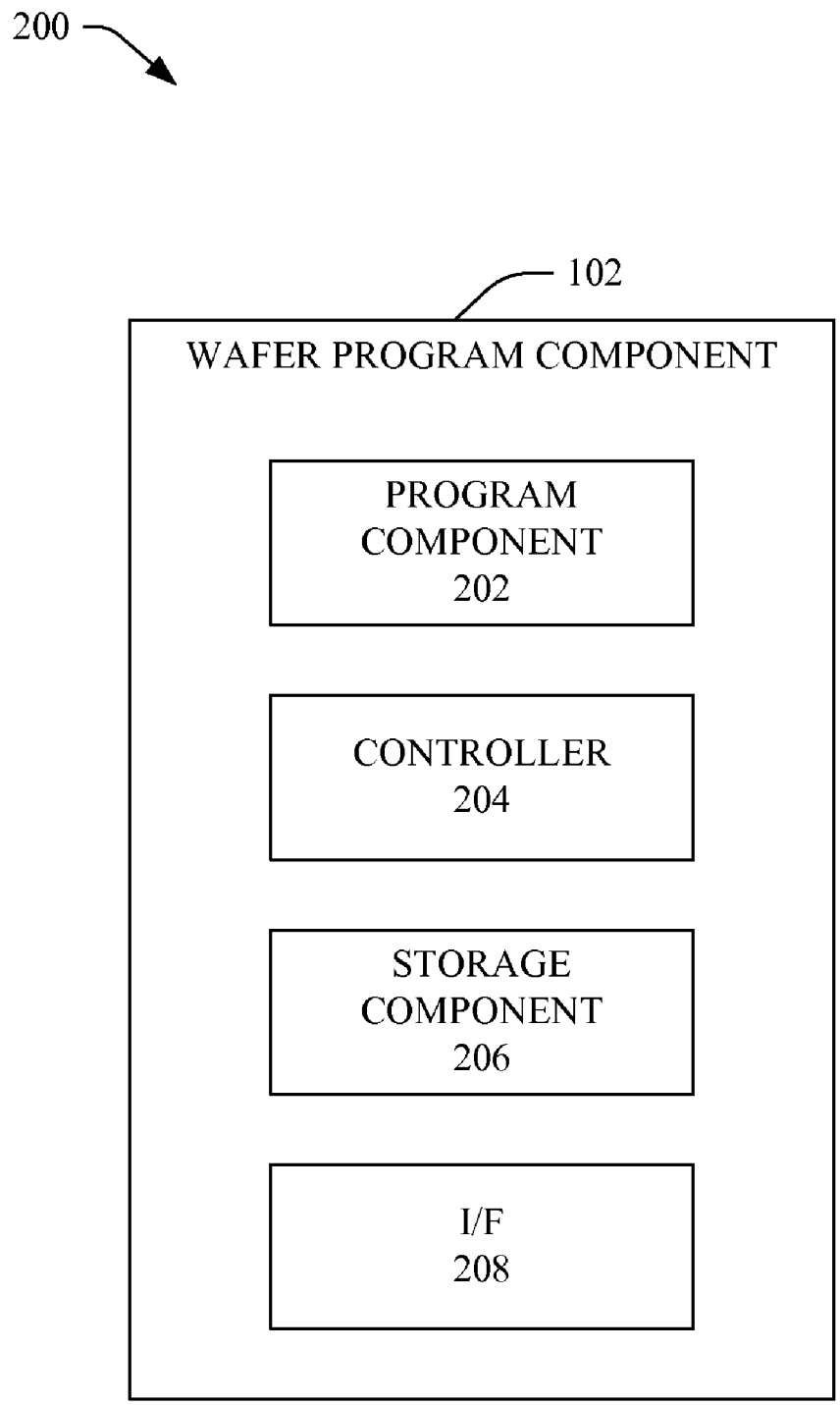
FIG. 2 depicts a block diagram of a wafer program component in accordance with an aspect of the subject matter disclosed herein.

Referring to FIG. 2, illustrated is a block diagram of a system 200 that can be comprised of a wafer program component 102 which can facilitate programming of data to the plurality of memory module$_0$ 106 through memory module$_n$ 110 (not shown). In accordance of one embodiment of the disclosed subject matter, the wafer program component 102 can be comprised of a program component 202 to facilitate obtaining, storing, and/or organizing of data (e.g., content) to be stored memory devices in the memory modules 106 through 110. It is to be appreciated that the program component can include basic computer resources such as suitable operating systems. It is also to be appreciated that the program component can be comprised of, in part or whole, computer instructions written in program languages such as, for example, C, C++, Java, microcode, or any combination thereof.

The program component 202 can facilitate interactions between users and a controller 204, a storage component 206, and/or an interface 208 (hereinafter referred to as "I/F 208"). The controller 204 can be comprised of one or more computers (not shown) comprised of hardware, software (e.g., in execution), and/or firmware, such as the computer system described in system 1300. It is to be appreciated that the controller component 204 can execute instructions from the program component 202 to facilitate the retrieval of data based on, for example, the type of device the data is stored, e.g., the controller component 204 can facilitate, in coordination with the program component 202, the execution of determining the subset of data that can be placed into one or more of the memory devices located on the wafer (e.g., 104) (not shown).

In accordance with one aspect of the disclosed subject matter, the program component 202 can facilitate the determination of the subset of data that can be stored in each of the memory devices within the respective memory modules 106, 108, 110. The program component 202 can store the subset of data into the storage component 206. The storage component 206 can be comprised of any hardware or electronic device used to store information (e.g., memory, magnetic tape, hard disc etc.).

The I/F 208 can be comprised of hardware and/or software that can facilitate an electrical connection and communication between the wafer program component 102 and the wafer, and the memory modules 106, 108, 110 that reside thereon. It is to be appreciated that I/F 208 can include and/or provide various adapters, connectors, channels, communication paths, etc. to integrate the wafer program component 102 into virtually any operating and/or database system(s) and/or with another system(s). In addition, I/F 208 can provide various adapters, connectors, channels, communication paths, etc., that can provide for interaction and/or communication with other components, data, and the like, associated with the system 200.

Figure 3:
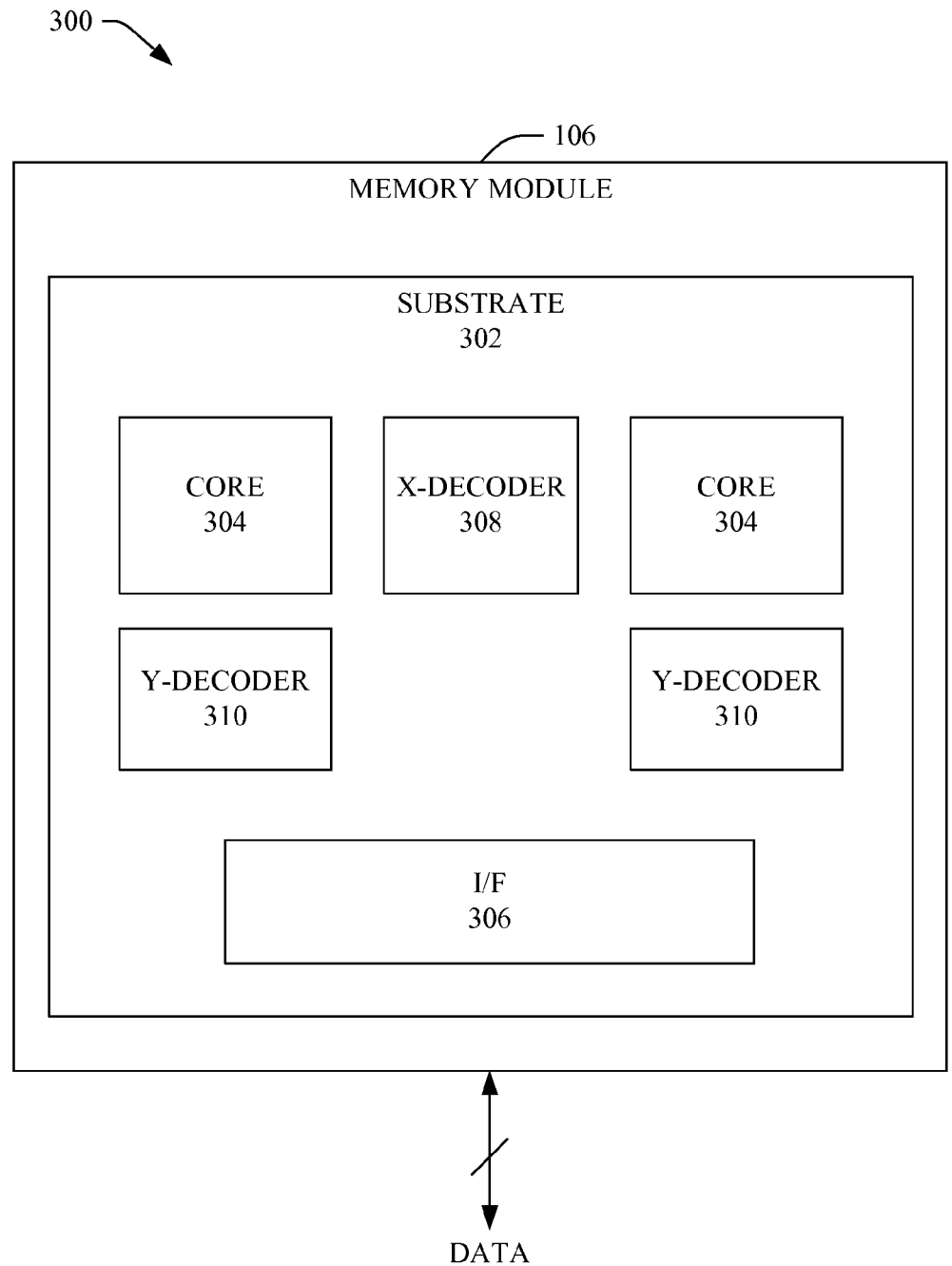
FIG. 3 depicts a block diagram of an example of a system that can store data in accordance with an embodiment of the disclosed subject matter.

Referring to FIG. 3, illustrated is a block diagram of a system 300 that can facilitate storage of data in accordance with the disclosed subject matter. In one aspect, system 300 can be employed in a memory device, such as a flash memory device (e.g., single-bit flash memory, multi-bit flash memory), that can be included in a memory module (e.g., 106, 108, 110) on a wafer (e.g., 104). The system 300 can be created on a semiconductor substrate 302 in which one or more core regions 304, which can be higher-density core regions, and one or more peripheral regions, which can be lower-density regions, can be formed. The high-density core regions can include one or more M by N arrays of individually addressable, substantially identical multi-bit memory cells (not shown). The lower-density peripheral regions can typically include an interface component 306 (hereinafter also referred to as "I/F 306") and programming circuitry for selectively addressing the individual memory cells. The programming circuitry can be represented in part by and can include one or more x-decoders 308 and one or more y-decoders 310 that can cooperate with the I/F 306 for selectively connecting a source, gate, and/or drain of selected addressed memory cells to predetermined voltages or impedances to effect designated operations (e.g., programming, reading, erasing) on the respective memory cells, and deriving necessary voltages to effect such operations.

The core(s) 304 can be a non-volatile memory array, e.g., memory that can retain the stored information even when not powered. The nonvolatile memory can include, but is not limited to, read-only memory (ROM), flash memory (e.g., single-bit flash memory, multi-bit flash memory), mask-programmed ROM, programmable ROM (PROM), Erasable PROM (EPROM), UV-erase EPROM, one-time programmable ROM, electrically erasable PROM (EEPROM), and/or nonvolatile random access memory (NVRAM) (e.g., Ferroelectric random access memory (FeRAM)), for example. Further, the I/F 306 can include and/or provide various adapters, connectors, channels, communication paths, etc. to integrate the system 300 into virtually any operating and/or database system(s) and/or with another system(s). In addition, I/F 306 can provide various adapters, connectors, channels, communication paths, etc., that can provide for interaction and/or communication with other components, data, and the like, associated with the system 300.

Figure 4:
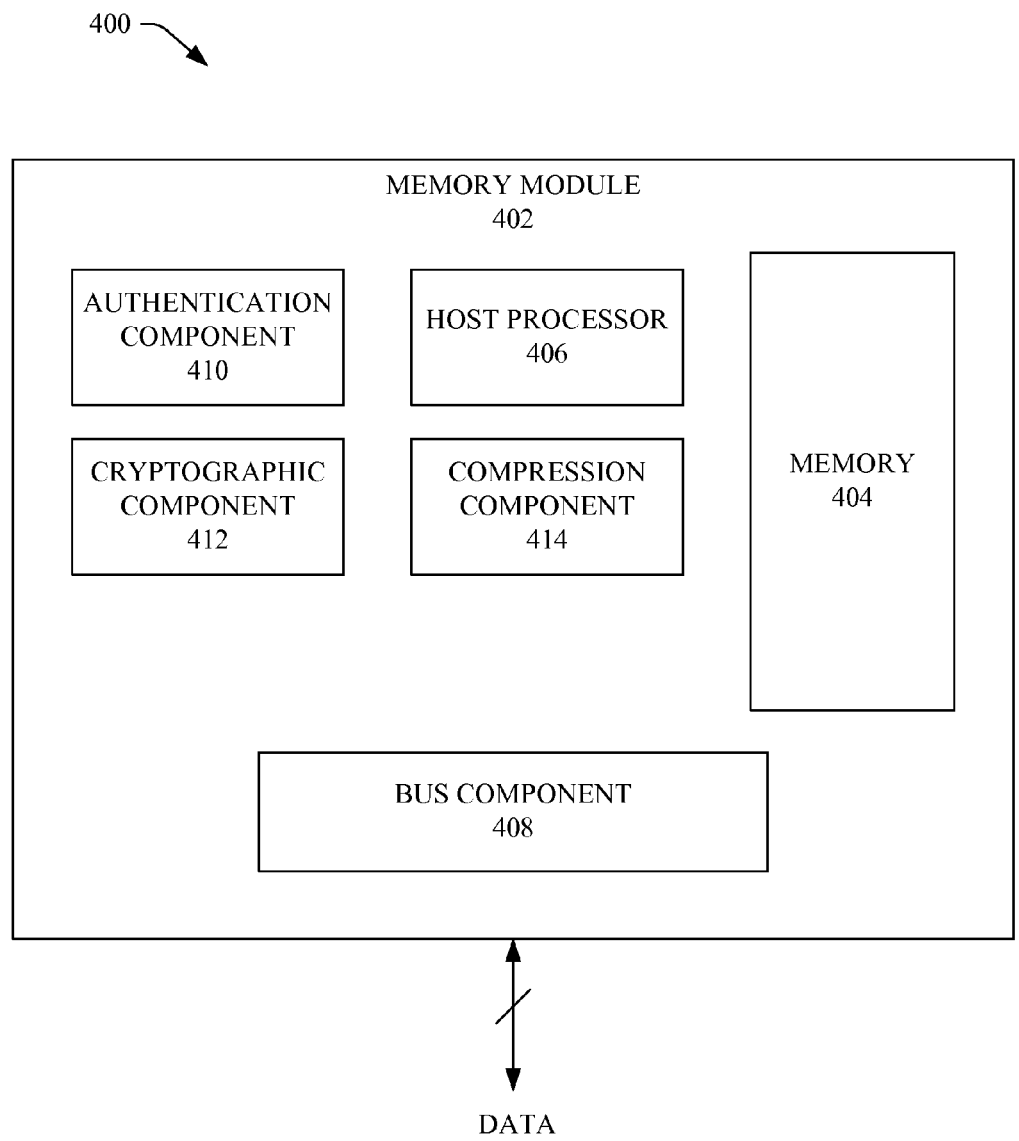
FIG. 4 illustrates a block diagram of a system that can store data in accordance with another embodiment of the subject matter disclosed herein.

Referring to FIG. 4, depicted is a block diagram of a system 400 that can facilitate storage of data in accordance with the disclosed subject matter. In accordance with an embodiment of the disclosed subject matter, system 400 can include a memory module 402 that can include a memory 404 that can receive data, can store data, and can provide data as an output. The memory module 402 can be the same as or similar to, and can include such functionality, as more fully described herein, for example, with regard to system 100 and/or system 300. Memory 404 can include one or more memory locations (e.g., memory cells) (not shown) in which data can be programmed and from which data can be read. The memory 404 (e.g., memory device) can be the same as or similar to, and can include such functionality, as more fully described herein, for example, with regard to the memory devices of system 100 and/or the memory of system 300. The memory 404 can be comprised of ROM, flash memory (e.g., single-bit flash memory, multi-bit flash memory), mask-programmed ROM, PROM, EPROM, UV-erase EPROM, one-time programmable ROM, EEPROM, and/or NVRAM, for example.

In accordance with one embodiment of the disclosed subject matter, system 400 can include a host processor 406 that can be associated with the memory 402. The host processor 406 can be a typical applications processor that can manage communications and run applications. For example, the host processor 406 can be a processor that can be utilized by a computer, a mobile handset, PDA, or other electronic device. The host processor 406 can generate commands, including read, write, and/or erase commands, in order to facilitate reading data from, writing data to, and/or erasing data from the memory 404, where the communication of information between the host processor 406 and the memory 404 can be facilitated via a bus component 408.

In accordance with another embodiment, the host processor 406 can be a stand-alone unit that can be associated with the memory module 402, and can generate and execute commands to access data to/from the memory 404.

In accordance with an aspect of the disclosed subject matter, the wafer program component 102 (not shown) can facilitate a signature authentication requirement for end-users to access a certain subset(s) of content stored in the memory 404. The certain subset(s) of content can include or relate to personalized information (e.g., identification information, bank account information, credit card information, etc.) that can be associated with a particular user and/or can be subscription-based content (e.g., specified applications, specified audio files, etc.) for which the user can subscribe in order to be granted access such information. In applications where such authentication is implemented, system 400 can include an authentication component 410 that can solicit authentication data from an entity or user, and, upon the authentication data so solicited, can be employed, individually and/or in conjunction with information acquired and ascertained as a result of biometric modalities employed, to facilitate control access to the memory 404. The authentication data can be in the form of a password (e.g., a sequence of humanly cognizable characters), a pass phrase (e.g., a sequence of alphanumeric characters that can be similar to a typical password but is conventionally of greater length and contains non-humanly cognizable characters in addition to humanly cognizable characters), a pass code (e.g., Personal Identification Number (PIN)), and the like, for example. Additionally and/or alternatively, public key infrastructure (PKI) data can also be employed by authentication component 410. PKI arrangements can provide for trusted third parties to vet, and affirm, entity identity through the use of public keys that typically can be certificates issued by the trusted third parties. Such arrangements can enable entities to be authenticated to each other, and to use information in certificates (e.g., public keys) and private keys, session keys, Traffic Encryption Keys (TEKs), cryptographic-system-specific keys, and/or other keys, to encrypt and decrypt messages communicated between entities.

The authentication component 410 can implement one or more machine-implemented techniques to identify an entity by its unique physical and behavioral characteristics and attributes. Biometric modalities that can be employed can include, for example, face recognition wherein measurements of key points on an entity's face can provide a unique pattern that can be associated with the entity, iris recognition that measures from the outer edge towards the pupil the patterns associated with the colored part of the eye—the iris—to detect unique features associated with an entity's iris, and finger print identification that scans the corrugated ridges of skin that are non-continuous and form a pattern that can provide distinguishing features to identify an entity.

In accordance with yet another aspect of the disclosed subject matter, the host processor component 406 and/or wafer program component 102 can facilitate the encryption and/or decryption of data that can be stored in the memory 404 by utilizing the cryptographic component 412. The cryptographic component 412 can include a security engine (not shown) that can be configured to perform cryptographic functions that can facilitate securing data written to, stored in, and/or read from the memory 404. Cryptographic functions, such as, for example, encryption, decryption, key generation, and/or hash, to facilitate data security can be employed (e.g., via software) by the security engine in conjunction with a host processor component 406 and can include use of symmetric and/or asymmetric algorithms, such as Advanced Encryption Standard (AES)—a block symmetric key cipher, Data Encryption Standard (DES), Triple Data Encryption Standard (3DES)—a block cipher form by utilizing the DES cipher at least three times, Secure Hash Algorithm (SHA) and its variants such as, for example, SHA-0, SHA-1, SHA-224, SHA-256, SHA-384, and SHA-512, and the Rivest, Shamir, and Adleman (RSA) encryption algorithm, and the like.

In accordance with yet another aspect of the disclosed subject matter, the host processor component 406 and/or wafer program component 102 can facilitate the compression of data that can be stored in the memory 404 by coordinating data transfers through the compression component 414. The compression component 414 can provide compression of data by encoding information using fewer bits than an unencoded representation of data would use through use of encoding schemes that can employ data compression algorithms, such as lossless compression algorithms or lossy compression algorithms, for example. The compression component 414 can be used in conjunction with any combination of other electric and/or semiconductor components (e.g., cryptographic component 412, authentication component 410, host processor 406) to perform a combination of operations on data to be stored in the memory 404 based on the type of data to be stored in the memory 404, such as, for example, end-user personal data (e.g., bank account information, credit card information, PIN numbers) and/or other data (e.g., applications, media files).

Referring again to the bus component 408, the bus component 408 can provide a network or electrical interconnect between electric and/or semiconductor components with the memory module 402 including, but not limited to, the authentication component 410, the compression component 414, the cryptographic component 412, the host processor 406, and/or the memory 404. The bus component 408 can be comprised of any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

In accordance with one embodiment of the disclosed subject matter, the memory module 402 can consist of one or more combinations of electronic and/or semiconductor devices/components. For example, the memory module 402 can include the memory 404, authentication component 410, cryptographic component 412, compression component 414, or any combination thereof. It is to be understood that one or more of the components authentication component 410, cryptographic component 412, and/or compression component 414 can be stand-alone units that can be associated with the memory module 402.

In one embodiment, memory module 402 can be implemented and/or contained on a single IC chip. In another embodiment, memory module 402 can be implemented and/or contained on a stand-alone application-specific integrated-circuit (ASIC) chip.

Figure 5:
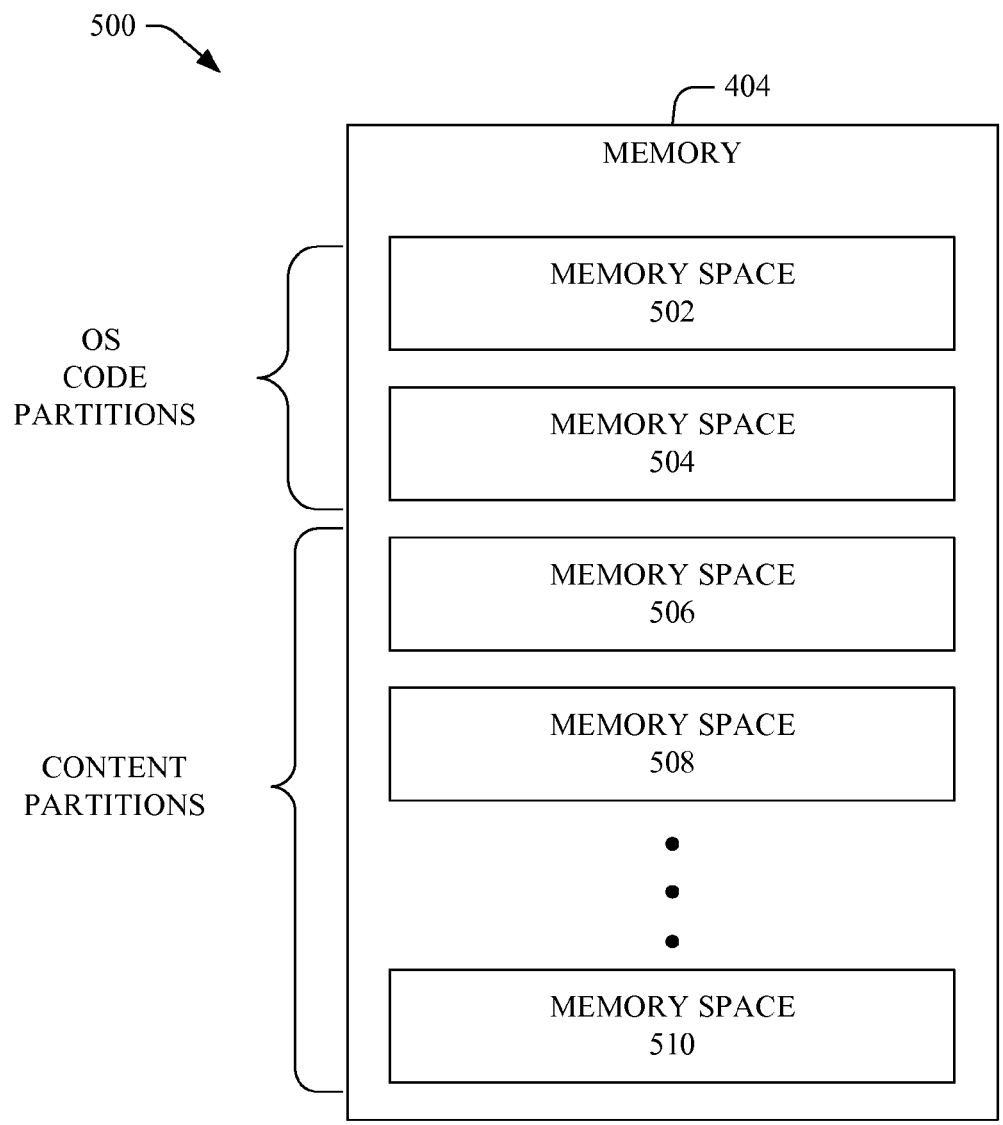
FIG. 5 depicts a block diagram of a system for allocation of memory within a memory device in accordance with an aspect of the subject matter disclosed herein.

Referring to FIG. 5, illustrated is a block diagram of a system 500 that allocation of memory space within a memory device. The system 500 can include a memory 404 that can include one or more memory locations (e.g., memory cells) in which data can be written and/or stored, and from which data can be read or erased. The memory 404 can be the same as or similar to, and can include such functionality, as more fully described herein, for example, with regard to memory 404 in system 400, the memory of system 300, and/or the memory devices of system 100.

The memory 302 can be partitioned into one or more memory spaces, memory space 502, memory space 504, memory space 506, memory space 508, and memory space 510 (hereinafter also collectively referred to as "memory spaces 502, 504, 506, 508, 510"). The memory spaces 502, 504, 506, 508, 510 can provide an abstract view of how memory can be allocated to provide blocks of storage for data content.

In accordance with one aspect of the disclosed subject matter, the wafer program component 102 (not shown) can facilitate the programming of one or more operating systems into one or more of the memory spaces 502, 504, 506, 508, 510, illustrated in FIG. 5 as the OS code partitions, which can be memory space 502 and/or memory space 504. In accordance with another aspect of the disclosed subject matter, the wafer program component 102 can facilitate the programming of data into the content partitions of the memory space 506, memory space 508, and/or memory space 510 wherein the data can be data specific to the type of electronic device, such as PDAs, mobile devices, and/or smart cards, for example, in which the memory 404 is being utilized. The data programmed into the content partitions (e.g., memory space 506, memory space 508, memory space 510) can also be, for example, subscription-based content and/or personalized information based on specific end-user information.

In accordance with one aspect of the disclosed subject matter, access to one or more of the memory spaces 502, 504, 506, 508, 510 can be restricted. For example, in accordance with one embodiment of the disclosed subject matter, the wafer program component 102 can facilitate that end-users provide authentication credentials to gain access to one or more of the memory spaces 502, 504, 506, 508, 510. In accordance with another aspect of the disclosed subject matter, access can be granted to end-users via a subscription-based service. Access can also be granted to the certain portions of the data contained in the memory spaces 502, 504, 506, 508, 510 without necessity of the end-users or entities providing authentication credentials, as desired.

It is to be appreciated and understood that the partitioning of the memory 404 described herein is only one illustrative example, and the subject innovation is not so limited. The subject innovation contemplates that the memory 404 can be partitioned, as desired, into virtually any number of partitions that can each store desired content.

Figure 6:
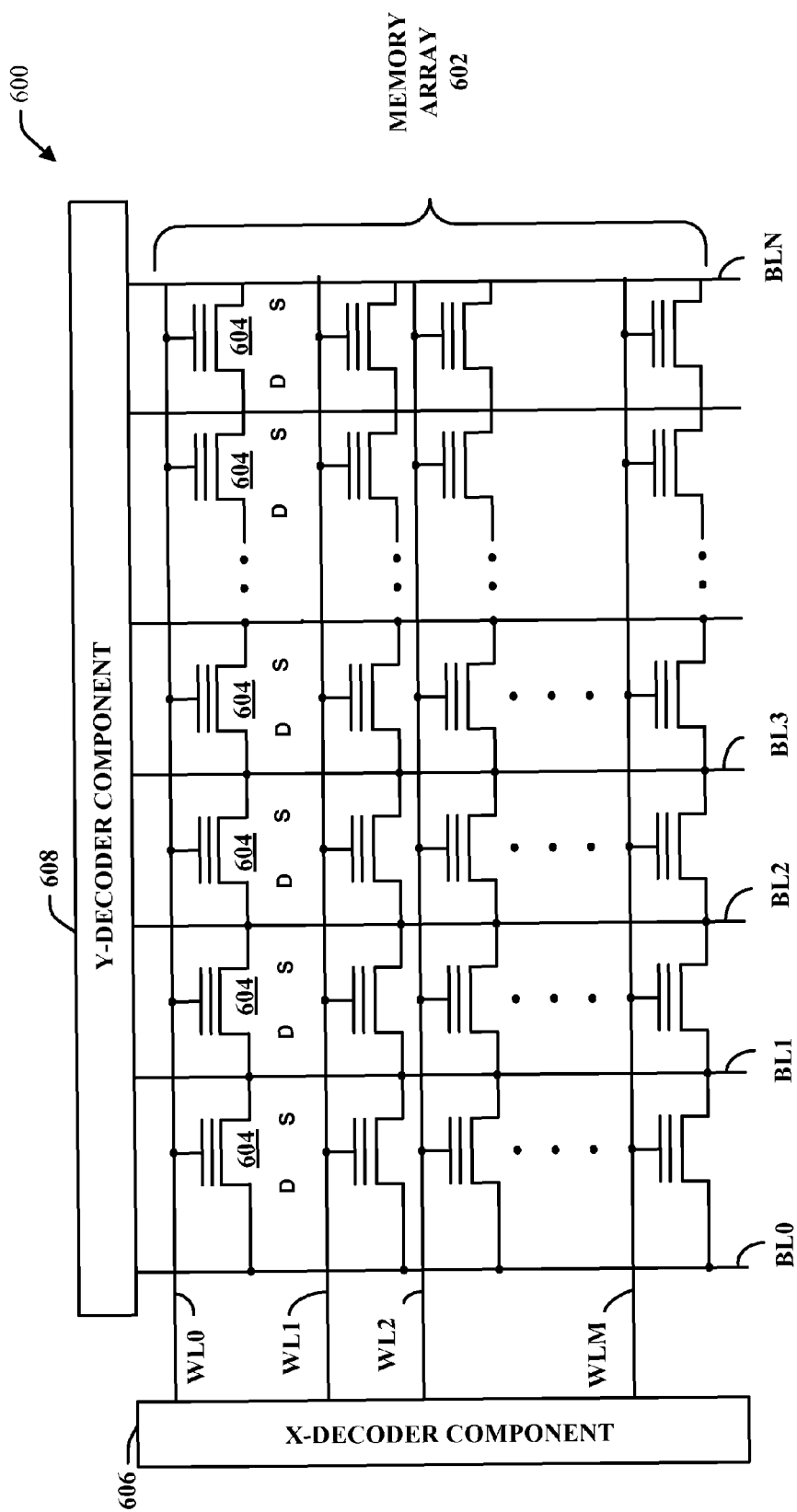
FIG. 6 depicts an example diagram of a system that can facilitate data storage in accordance with an aspect of the disclosed subject matter.

Turning to FIG. 6, depicted is an example diagram of a system 600 that can facilitate data storage in accordance with the disclosed subject matter. The system 600 can include a memory array(s) 602 that can include a plurality of memory cells 604 that each can be comprised of a drain, gate, and source. Each memory cell 604 can have one or more levels therein and can thereby store one or more bits of data therein, where each level can be associated with a bit of data. The memory array 602 can be included in the memory device described in system 100, the memory device described in system 300, and/or the memory 404, for example. The system 600 can include an X-decoder component 606 (e.g., word line (WL) decoder) and a Y-decoder component 608 (e.g., bit line (BL) decoder) that can each respectively decode inputs/outputs during various operations (e.g., programming, reading, verifying, erasing) that can be performed on the memory cells 604. The X-decoder component 606 and Y-decoder component 608 can each receive address bus information from a host processor (e.g., 406) and/or system controller (not shown) or the like, and can utilize such information to facilitate accessing or selecting the desired memory cell(s) (e.g., memory location(s)) associated with the command. The memory cells 604 can be formed in M rows and N columns. A common WL can be attached to the gate of each memory cell 604 in a row, such as word-lines WL0, WL1, WL2, through WLM. A common BL can be attached to each cell 604 in a column, such as bit-lines BL0, BL1, through BLN. A WL can contain, for example, a plurality of elements (e.g., 512, 1024, 2048) forming multiple words. A sector can include a plurality of WLs, such as, for example, 512 WLs that can provide 512 k elements of memory. In accordance with an aspect of the disclosed subject matter, respective voltages can be applied to one or more memory cells 604 through the WLs and BLs to facilitate performing operations, such as program, read, erase, and the like.

Figure 7:
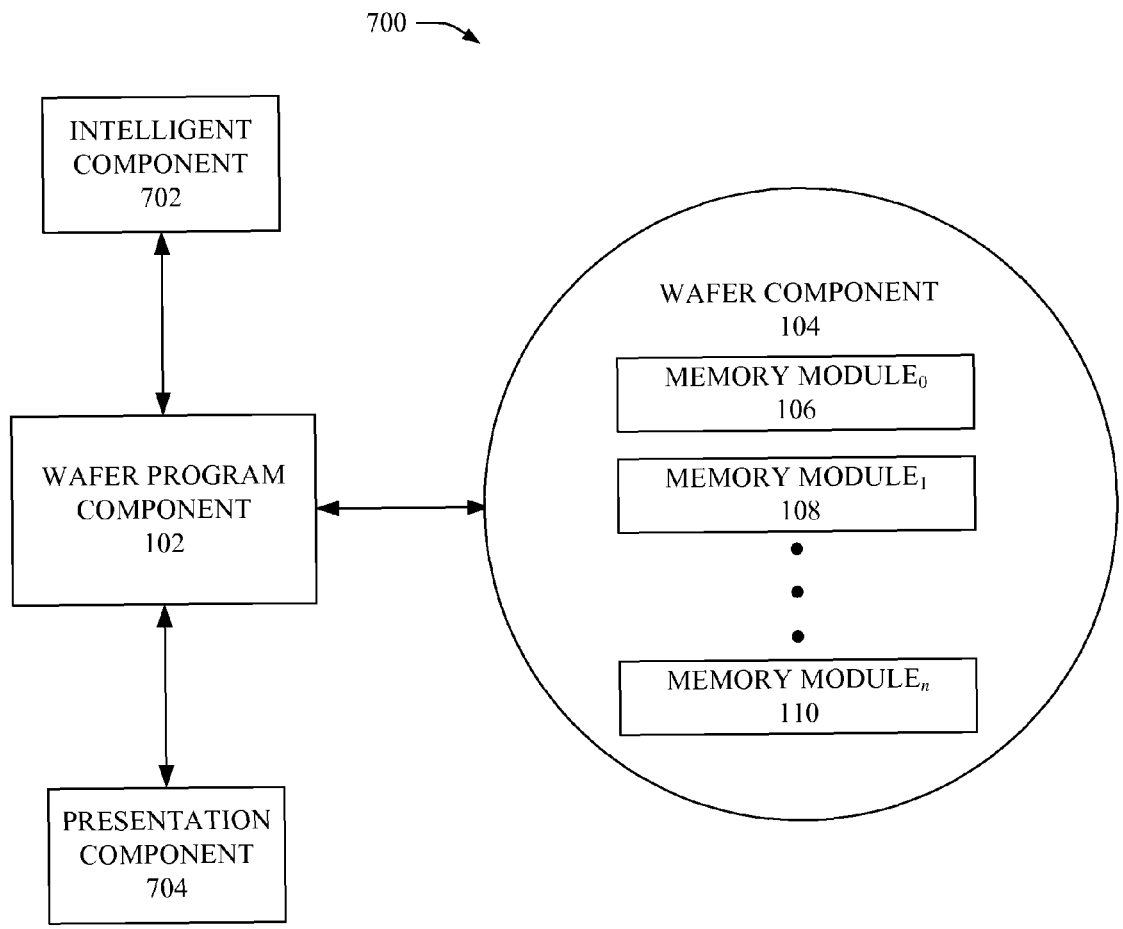
FIG. 7 illustrates a block diagram of a system that employs intelligence to facilitate a program of content to memory devices in accordance with an embodiment of the disclosed subject matter.

Turning to FIG. 7, depicted is a system 700 that can employ intelligence to facilitate programming data to memory devices contained on a wafer in accordance with the disclosed subject matter. System 700 can include a wafer program component 102 that can facilitate programming data (e.g., content) to a plurality of memory devices (not shown) respectively included in a plurality of memory modules (e.g., 402), memory module$_0$ 106, memory module$_1$ 108, and up through memory module$_n$ 110, that can be contained on a wafer component 104. The wafer program component 102, memory modules (e.g., 106, 108, 110) each can be substantially similar to respective components and can include such respective functionality as described herein, for example, with regard to system 100, system 200, system 300, system 400, system 500, and/or system 600.

The system 700 can further include an intelligent component 702 that can be associated with the wafer program component 102 to facilitate analyzing data and can make an inference(s) and/or a determination(s) regarding, for example, a particular subset of data that is to be programmed and stored in the memory (e.g., 404) based on predefined criteria, such as the type of electronic device in which the memory is to be utilized, characteristics of a user or expected user of the electronic device, the type of content (e.g., subscription-based content, personal data, unrestricted data, etc.), entities (e.g., companies, such as financial institutions, cellular phone provider, Internet access provider, application (s) provider, media provider, etc.) associated with the electronic device, authentication protocol associated with programmed content, cryptographic protocol associated with programmed content, data compression associated with programmed content, and/or whether the memory devices are to receive identical content or customized content when programmed by the wafer program component 102.

For example, the intelligent component 702 can infer a subset of content that can be provided to respective memory devices (e.g., 404) based on the type electronic user device the memory modules 106, 108, 110 is to be installed or based on the desired content of a user wishes to be stored in the memory devices, for example. The intelligent component 702 can analyze such information and based on current and/or historical evidence such as, for example, what type of data a user(s) have historically preferred, can render an inference regarding what information is to be stored into the plurality of memory devices in respective memory modules, such as memory modules 106, 108, 110, in accordance with the disclosed subject matter.

It is to be understood that the intelligent component 702 can provide for reasoning about or infer states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data (e.g., historical data), whether or not the events are correlated in close temporal proximity, and whether the events and data come from one or several event and data sources. Various classification (explicitly and/or implicitly trained) schemes and/or systems (e.g., support vector machines, neural networks, expert systems, Bayesian belief networks, fuzzy logic, data fusion engines . . . ) can be employed in connection with performing automatic and/or inferred action in connection with the disclosed subject matter.

A classifier is a function that maps an input attribute vector, x=(x1, x2, x3, x4, xn), to a confidence that the input belongs to a class, that is, f(x)=confidence(class). Such classification can employ a probabilistic and/or statistical-based analysis (e.g., factoring into the analysis utilities and costs) to prognose or infer an action that a user desires to be automatically performed. A support vector machine (SVM) is an example of a classifier that can be employed. The SVM operates by finding a hypersurface in the space of possible inputs, which hypersurface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

System 700 also can include a presentation component 704 that can present data associated with the wafer component 102. It is to be appreciated that the presentation component 704 can be incorporated into the wafer program component 102 and/or a stand-alone unit. The presentation component 704 can provide various types of user interfaces to facilitate interaction between a user and any component coupled to the wafer component 102.

The presentation component 704 can provide one or more graphical user interfaces (GUIs), command line interfaces, and the like. For example, a GUI can be rendered that provides a user with a region or means to load, import, read, etc., data, and can include a region to present the results of such. These regions can comprise known text and/or graphic regions comprising dialogue boxes, static controls, drop-down-menus, list boxes, pop-up menus, as edit controls, combo boxes, radio buttons, check boxes, push buttons, and graphic boxes. In addition, utilities to facilitate the presentation such as vertical and/or horizontal scroll bars for navigation and toolbar buttons to determine whether a region will be viewable can be employed. For example, the user can interact with one or more of the components coupled to and/or incorporated into the processor 706.

The user can also interact with the regions to select and provide information via various devices such as a mouse, a roller ball, a keypad, a keyboard, a pen and/or voice activation, for example. Typically, a mechanism such as a push button or the enter key on the keyboard can be employed subsequent entering the information in order to initiate the search. However, it is to be appreciated that the claimed subject matter is not so limited. For example, merely highlighting a check box can initiate information conveyance. In another example, a command line interface can be employed. For example, the command line interface can prompt (e.g., via a text message on a display and an audio tone) the user for information via providing a text message. The user can than provide suitable information, such as alpha-numeric input corresponding to an option provided in the interface prompt or an answer to a question posed in the prompt. It is to be appreciated that the command line interface can be employed in connection with a GUI and/or API. In addition, the command line interface can be employed in connection with hardware (e.g., video cards) and/or displays (e.g., black and white, and EGA) with limited graphic support, and/or low bandwidth communication channels.

The aforementioned systems have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

FIGS. 8-12 illustrate methodologies and/or flow diagrams in accordance with the disclosed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Figure 8:
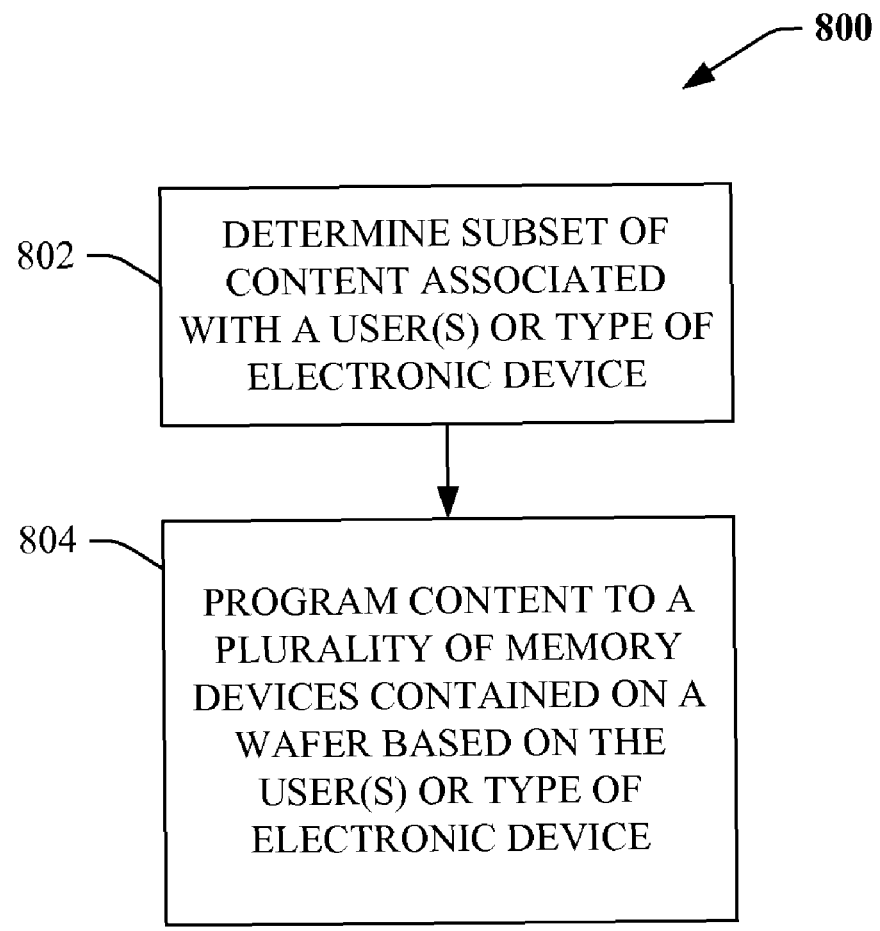
FIG. 8 depicts a methodology that facilitates programming content to memory devices in accordance with an aspect of the disclosed subject matter.

Referring to FIG. 8, a methodology 800 that can facilitate programming data to memory devices in accordance with the disclosed subject matter is illustrated. At 802, one or more subsets of content that can be associated with at least one user or at least one type of electronic device (e.g., cellular phone, PDA, smart card, etc.) can be determined. The subset(s) of content can include, for example, operating systems, applications (e.g., word processor applications, game applications, etc.), media files, and other data associated with a type of electronic device; data related to an entity (e.g., financial institution, cellular phone provider, Internet provider, media provider, etc.) associated with the electronic device and/or user of the electronic device; and/or personalized data (e.g., identification information, bank account information, credit card information, etc.) associated with a user of the electronic device. In accordance with one aspect of the disclosed subject matter, the subset(s) of content can be determined based on a type of electronic device the memory devices within each of memory modules$_0$ 106 through memory module$_n$ 110 will be associated or installed. For example, a cellular phone can include a certain subset of data that can be data associated with the cellular phone provider, game programs, applications, personalized data, and/or security codes. In accordance with another aspect of the disclosed subject matter, the subset(s) of content can be determined based on, for example, specific end-user personal information (e.g., bank account information, credit card information, and/or PIN numbers, for example). Further, in still another aspect, the same subset of content can be programmed to all the memory devices on the wafer, or alternatively, different subsets of content can programmed to respective memory devices, where the different subsets of content can be tailored based on the electronic device in which the memory device is to be utilized, user(s) associated with the electronic device, and/or entity(ies) associated with the electronic device.

At 804, the desired subset(s) of content can be programmed into the plurality of memory devices (e.g., within memory modules 106, 108, 110) contained on the wafer (e.g., 104). In accordance with one aspect of the disclosed subject matter, the wafer program component 102 can facilitate programming (e.g., storing) the desired subset(s) of content to the plurality of memory devices while the memory devices are still on the wafer (e.g., prior to being cut into individual dies). Further, the wafer program component 102 can facilitate programming the subset(s) of content to the plurality of memory devices at the same or substantially the same time (e.g., in parallel) to effectively increase the overall efficiency at which the memory devices can be programmed. At this point, methodology 800 can end.

Figure 9:
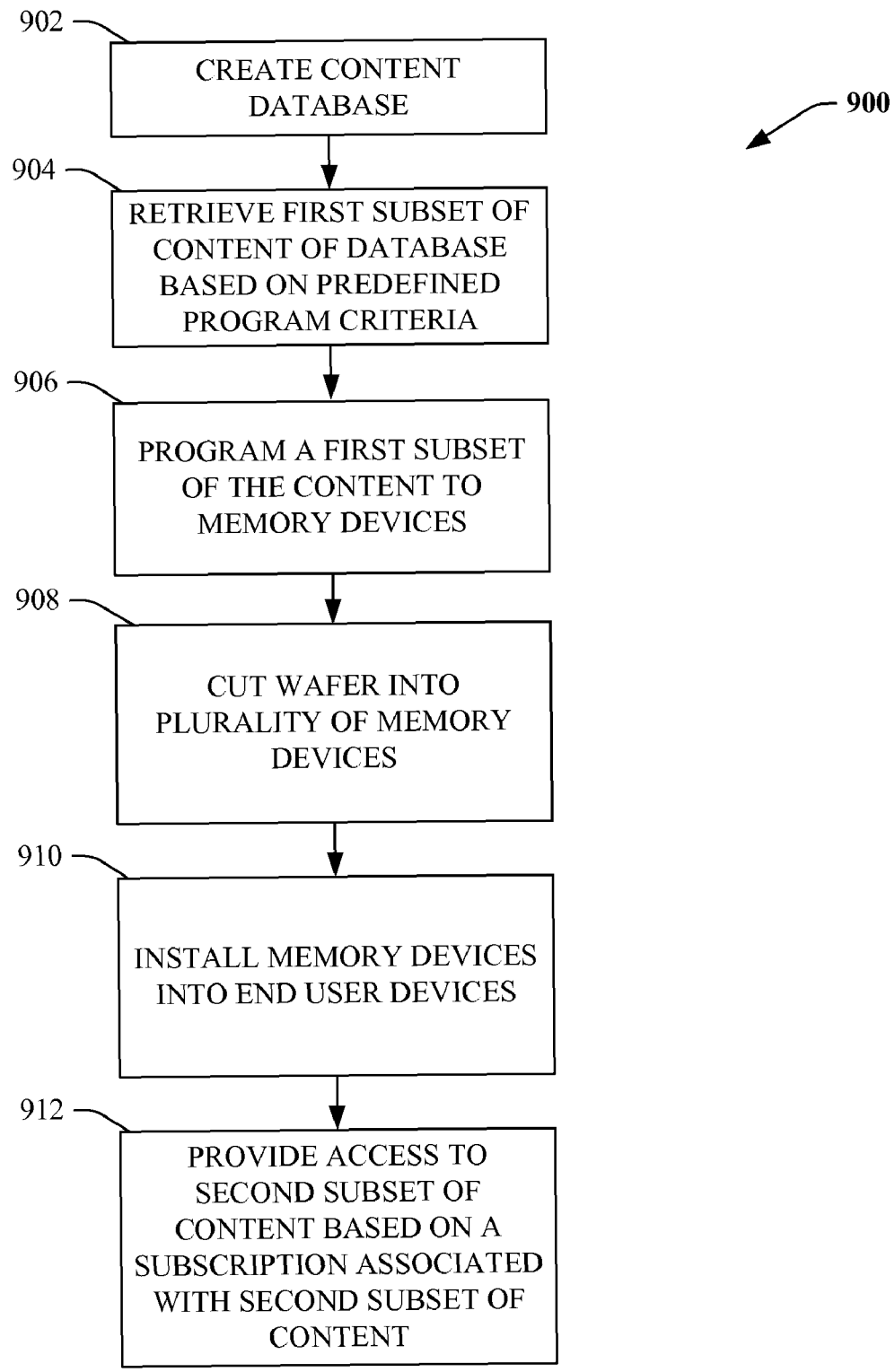
FIG. 9 illustrates another methodology that facilitates programming content to memory devices in accordance with an aspect of the disclosed subject matter.

Referring to FIG. 9, a methodology 900 that can facilitate programming data content to memory devices in accordance with the disclosed subject matter is illustrated. Methodology 900 can facilitate programming desired content to a plurality of memory devices contained on a wafer at the same time, or substantially the same time. At 902, a content database (e.g., data database, information database) can be created and content (e.g., data, and/or information) can be stored in a storage device such as, for example, memory, a floppy drive, a hard drive and/or magnetic tape device. The content can include, for example, operating systems, applications (e.g., word processor applications, game applications, etc.), media files, and other data associated with a type of electronic device; data related to an entity (e.g., financial institution, cellular phone provider, Internet provider, media provider, etc.) associated with the electronic device and/or user of the electronic device; and/or personalized data (e.g., identification information, bank account information, credit card information, etc.) associated with a user of the electronic device. In accordance with one aspect of the disclosed subject matter, the content database can include different content for different types of end-user electronic devices that the memory devices (e.g., associated with memory modules 106, 108, 110) can be associated with such as, for example, cellular phones, smart cards, PDAs, and/or security cards, as more fully described herein.

At 904, a first subset of content can be retrieved from the content database based on predetermined or predefined program criteria, such as, for example, a type of electronic device, a user(s) associated with the electronic device, and/or an entity(ies) associated with the electronic device. In accordance with one aspect of the disclosed subject matter, the wafer program component 102 can facilitate retrieval of the subset of content based on the type of electronic device in which a memory device is to be utilized, where the memory device can store the subset of content, and/or a user(s) and/or entity associated with the electronic device. In accordance with another aspect of the disclosed subject matter, the wafer program component 102 can facilitate the retrieval of the subset of content based on the type of information (e.g., audio and/or video data for example) that is to be stored into one or more of the devices (e.g., memory modules 106, 108, 110).

At 906, the first subset of content can be programmed into the plurality of memory devices, within respective memory modules, on the wafer. In accordance with one aspect of the disclosed subject matter, the wafer program component 102 can facilitate programming the first subset of content into the plurality of memory devices while they are still in wafer form (e.g., prior to being cut into individual dies). Further, the wafer program component 102 can facilitate programming the subset of content into the plurality of memory devices at the same or substantially the same time (e.g., in parallel) to increase the efficiency at which the memory devices (e.g., memory modules 106, 108, 110) can be programmed.

At 908, the wafer component 104 can be cut or diced into a plurality of dies, where each die can be a memory module (e.g., 106, 108, 110, 402) that can each respectively include a memory device (e.g., 404). In accordance with one embodiment of the disclosed subject matter, the first subset of content can reside in the memory devices when the memory devices are cut into individual dies. The dies can then be placed in an IC package (e.g., plastic or ceramic). In accordance with another embodiment of the disclosed subject matter, the first subset of content can be programmed into the individual memory devices once the dies are placed in the IC package.

At 910, the memory devices can be installed into end-user electronic devices, such as PDAs, watches, cell phones, electronic organizers, and/or smart cards, for example. In accordance with an aspect of the disclosed subject matter, the first subset of content programmed into the memory devices (e.g., at reference numeral 906) can still reside in the memory devices at this point.

At 912, a second subset of content, which can be a portion of the first subset of content, can be accessed controlled (e.g., access restricted) via associated access rights, attributes, and authentication credentials to support end-user subscription-based access to the second subset of content. In accordance with an aspect of the disclosed subject matter, the authentication of the second subset of content can be in the form of a password (e.g., a sequence of humanly cognizable characters), a pass phrase (e.g., a sequence of alphanumeric characters that can be similar to a typical password but is conventionally of greater length and contains non-humanly cognizable characters in addition to humanly cognizable characters), a pass code (e.g., Personal Identification Number (PIN)), and the like, for example. It is to be appreciated that the second subset of content can be comprised of one or more disparate subsets of content, where each disparate subset of content can be associated with disparate authentication protocol and/or disparate authentication information. Each disparate subset of content can accessed via presentation of respective authentication information in accordance with a respective authentication protocol associated therewith. At this point, methodology 900 can end.

Figure 10:
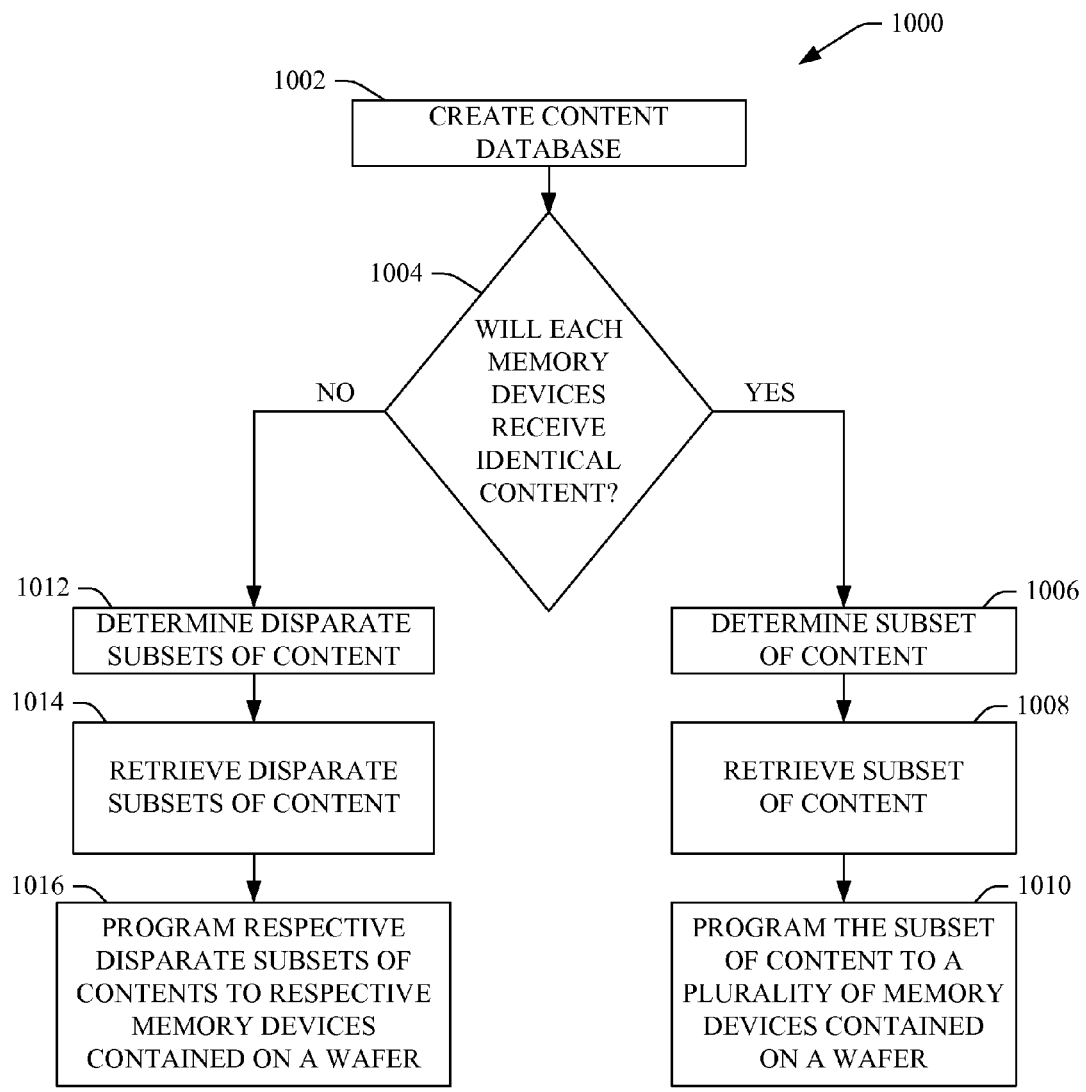
FIG. 10 depicts a methodology that facilitates programming a subset of content to memory devices in accordance with an aspect of the disclosed subject matter.

FIG. 10 depicts a methodology 1000 that can facilitate programming content into the memory devices in accordance with the disclosed subject matter. At 1002, a content database can be created and content can be stored in a storage device such as, for example, memory, hard drives, and/or magnetic tape devices. In accordance with one aspect of the disclosed subject matter, the content database can include content associated with different types of end-user electronic devices (e.g., cellular phones, PDAs, smart cards, etc.) in which the memory devices can be utilized. In another aspect, the memory devices can be formed on a wafer and can be programmed (e.g., in parallel) with the same or different content, as desired, while contained on the wafer.

At 1004, a determination can be made as to whether each of the memory devices on the wafer is to receive identical content. If it is determined that each of the memory devices on the wafer is to receive identical content, then, at 1006, a subset of content can be determined, where the subset of content can include all or a portion of the content contained in the content database. In accordance with one aspect of the disclosed subject matter, the subset of content can be selected based on the type of electronic device with which associated therewith, the desires/requirements of a user(s) or expected user(s) of the electronic device, and/or an entity(ies) associated with the electronic device.

At 1008, the subset of content can be retrieved from the content database. At 1010, the subset of content can be programmed to the plurality of memory devices, within respective memory modules, contained on the wafer. In one aspect, the subset of content can be programmed in parallel such that the subset of content can be programmed to each of the memory devices at the same time, or substantially the same time.

Turning back to reference numeral 1004, if it is determined that at least one of the memory devices on the wafer is to receive different data content, then, at 1012, disparate subsets of content can be determined, where each disparate subset of content can be comprised of all or a portion of the content contained in the content database. In accordance with one aspect of the disclosed subject matter, the subset of content can be selected based on the type of electronic device with which associated therewith, the desires/requirements of a user(s) or expected user(s) of the electronic device, and/or an entity(ies) associated with the electronic device. For example, a first disparate subset of content can include a first set of applications associated with a first service provider (e.g., cellular phone provider, Internet provider), and a first set of media files; and a second disparate subset of content can include a second set of applications associated with a second service provider, and a second set of media files.

At 1014, the disparate subsets of content can be retrieved from the content database. At 1016, each of the disparate subsets of content can be programmed to the corresponding memory devices on the wafer. In accordance with an aspect of the disclosed subject matter, the wafer program component 102 can facilitate programming the subset of content based on respective personalized information of at least one user and/or entity into the plurality of memory devices at the same or substantially the same time (e.g., in parallel) to increase the efficiency at which the memory devices can be programmed. At this point, methodology 1000 can end.

Figure 11:
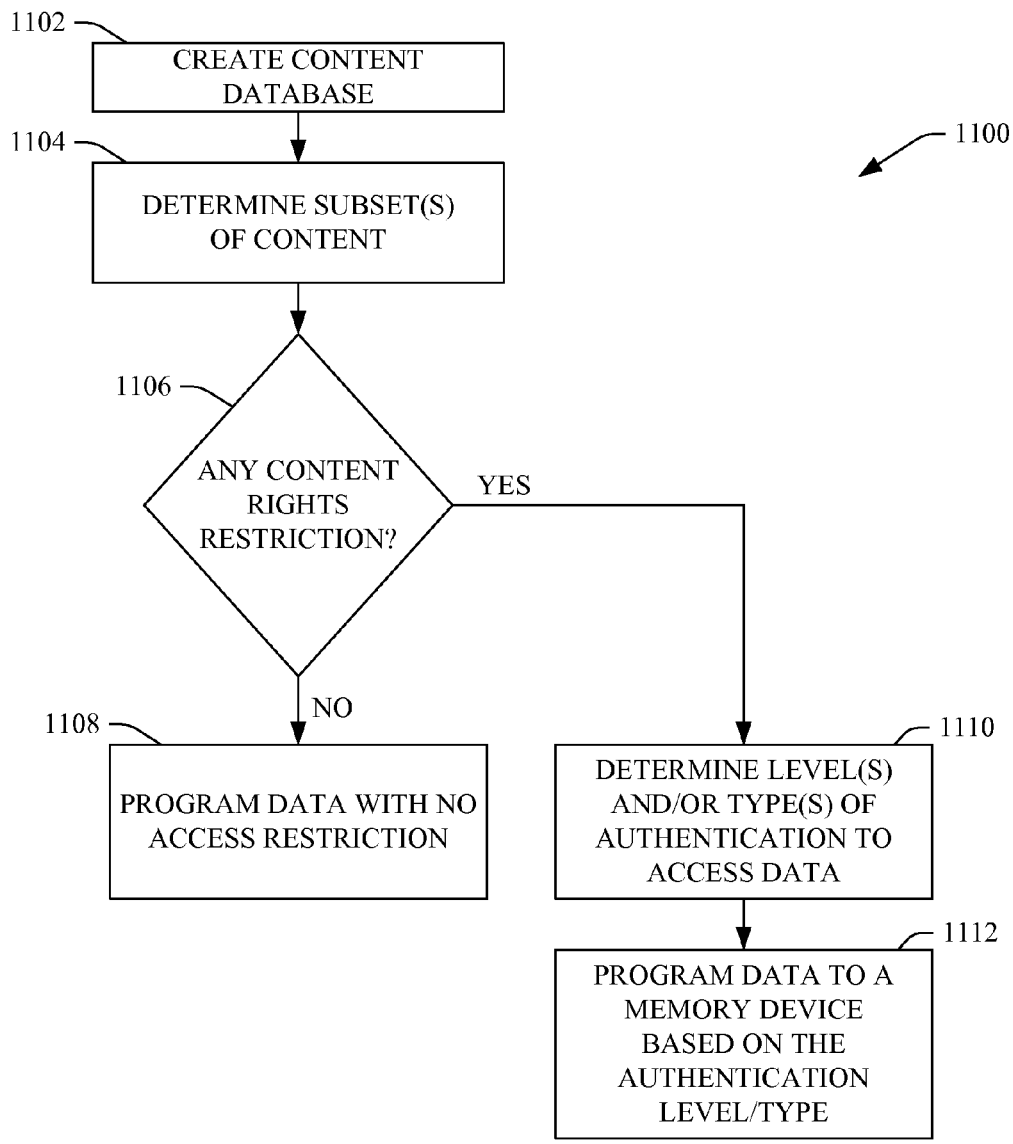
FIG. 11 illustrates a methodology that facilitates programming data associated with subscriptions to memory devices in accordance with an aspect of the subject matter disclosed herein.

Turning to FIG. 11, illustrated is a methodology 1100 that can facilitate programming rights-restricted data into memory devices in accordance with the disclosed subject matter. At 1102, a content database, which can also be referred to as an information database or data database, can be created and data (e.g., content) can be stored in a storage device such as, for example, memory, a floppy drive, a hard drive and/or magnetic tape. At 1104, one or more subsets of content can be determined, where the subset(s) of content can include all or a portion of the content contained in the content database. In accordance with one aspect, the subset(s) of content can be selected or determined based on the type of electronic device with which associated therewith, the desires/requirements of a user(s) or expected user(s) of the electronic device, and/or an entity(ies) associated with the electronic device. In another aspect, as desired, the same subset of content, or, alternatively, disparate subsets of content, can be programmed (e.g., in parallel) to respective memory devices (within memory modules) contained on a wafer.

At 1106, a determination can be made as to whether any of the content associated with the subset(s) of content is rights-restricted, such that authentication information is to be presented in order to access such content. Certain content (e.g., applications, games, media files, etc.) can be rights-restricted, where a subscription can be required in order to be authorized to access such certain content. If a user subscribes with regard to such content, the user can be provided associated authentication information that can be inputted into the electronic device that contains the content, and such content can be accessed if proper authentication credentials are presented. Other content can be certain personalized information that can be rights-restricted, such as identification information, bank account information, credit card information, etc., where proper authentication credentials are to be presented (e.g., input) to the electronic device in order for a user to access such content. In one aspect, the authentication credentials can be in the form of a password, a pass phrase, a pass code (e.g., PIN), and the like, for example. Still other content can have unrestricted access rights and can be accessed by a user of the electronic device without providing authentication credentials.

If it is determined that all of data associated with the subset(s) of content is unrestricted, then, at 1108, the subset(s) of content can be programmed to the memory device without a restriction placed on the access rights to such subset(s) of content. The subset(s) of content can be programmed in parallel to respective memory devices contained in the wafer to efficiently program such memory devices, where parallel programming of the memory devices while on the wafer can facilitate reducing manufacturing cost and/or increasing productivity, for example.

If, at 1106, it is determined that at least a portion of the subset(s) of content is rights-restricted, then at 1110, a level(s) and/or type(s) of authentication can be determined with respect to each portion of content that is rights-restricted. For example, a subset of content can include a gaming application that can require a subscription by the user and proper authentication credentials be provided in order to access the gaming application, and can also include personalized information (e.g., user's credit card information) that can require disparate authentication credentials be provided in order to access such personalized information.

At 1112, the subset(s) of content can be programmed and stored, respectively, in the desired memory devices contained on the wafer, with rights-restricted content locked or otherwise made inaccessible to user(s) of the electronic device(s) that contains the memory device(s) until proper authentication credentials associated with such content is provided (e.g., input) into the electronic device. In one aspect, a wafer program component (e.g., 102) can program the subset(s) of content and associated rights-restriction information to respective memory devices on the wafer in parallel to facilitate efficient programming of the memory devices. At this point, methodology 1100 can end.

Figure 12:
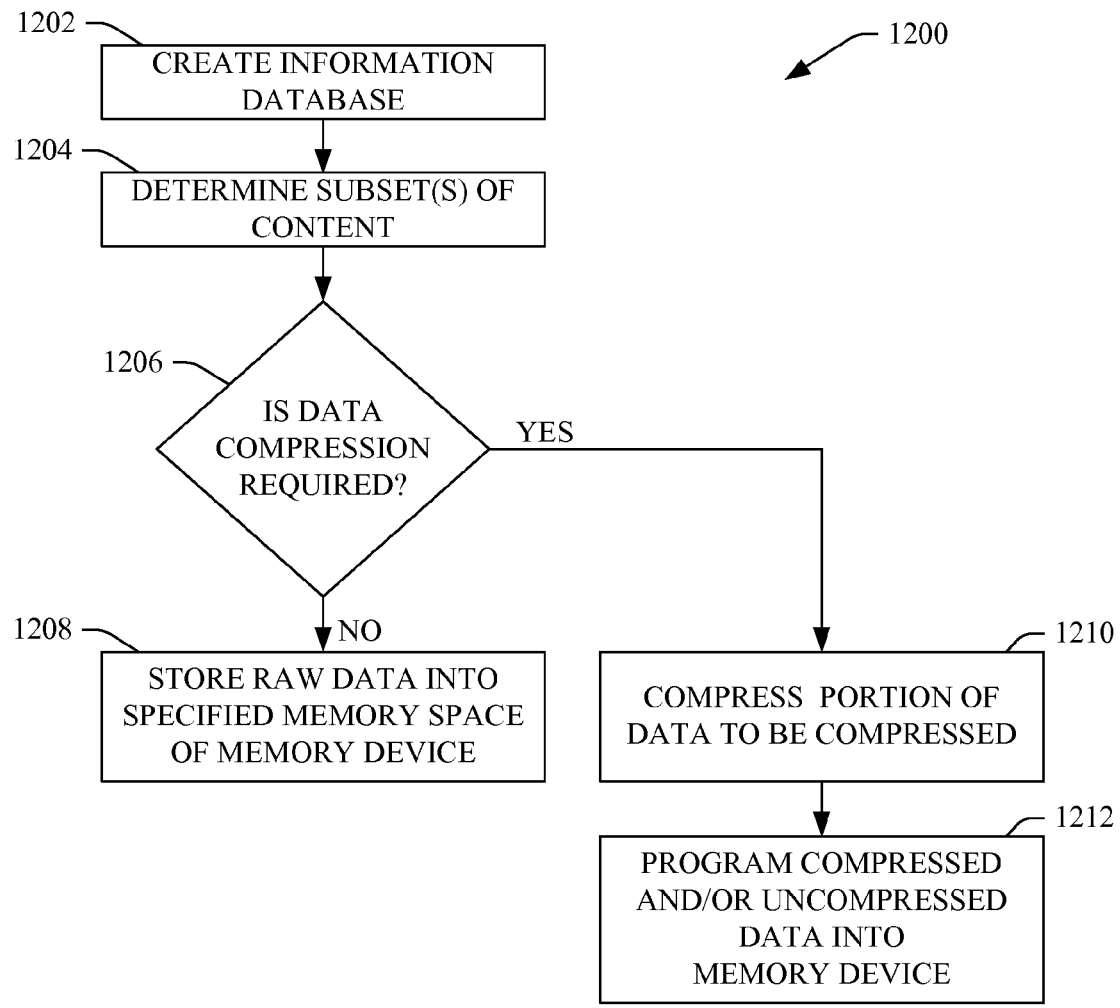
FIG. 12 illustrates a methodology that facilitates programming compressed data to memory devices in accordance with an aspect of the subject matter disclosed herein.

Referring to FIG. 12, illustrated is a methodology 1200 that can facilitate programming compressed data to memory devices in accordance with the disclosed subject matter. At 1202, a content database can be created and data can be stored to storage devices (e.g., memory, hard drive, and/or magnetic tape device, for example). In accordance with one aspect of the disclosed subject matter, the content database can include data for different types of end-user electronic devices (e.g., cell phones, smart cards, PDAs, and/or security cards, for example). At 1204, one or more subsets of content (e.g., applications, media files, personalized information, etc.) can be determined, where the subset(s) of content can be respectively associated with an electronic device (e.g., cellular phone, PDA, smart card, etc.), a user of the electronic device, and/or an entity associated with the electronic device.

At 1206, a determination can be made as to whether the subset(s) of content, or a portion(s) thereof, is to be compressed. If it is determined that none of the subset(s) of content is to be compressed, then, at 1208, the subset(s) of content can be programmed to respective memory devices, which can be within memory modules, on a wafer. In one aspect, a wafer program component (e.g., 102) can program the subset(s) of content to the respective memory devices in parallel to facilitate efficient programming of the memory devices, which can reduce manufacturing cost and/or increase productivity.

If, at 1206, it is determined that all or a portion(s) of the subset(s) of content is to be compressed, then, at 1210, the portion(s) of the subset(s) of content for which compression is desired can be compressed. In one aspect, the wafer program component can include or can be associated with a processor that can facilitate compressing the data desired to be compressed. The data to be compressed can be compressed in accordance with any suitable data compression algorithm, such as, for example, lossless compression algorithms or lossy compression algorithms. Other data that is not to be compressed can remain uncompressed.

At 1212, the compressed content and/or uncompressed content can be organized in accordance with the respective subset(s) of content and can be programmed to respective memory devices in which the respective subset(s) of content can be stored. In one aspect, the wafer program component can program the subset(s) of content, which can include compressed and/or uncompressed data, to the respective memory devices in parallel to facilitate efficient programming of the memory devices, which can reduce manufacturing cost and/or increase productivity. At this point, methodology 1200 can end.

As utilized herein, terms "component," "system," "interface," and the like, are intended to refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the disclosed subject matter.

Some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

Figure 13:
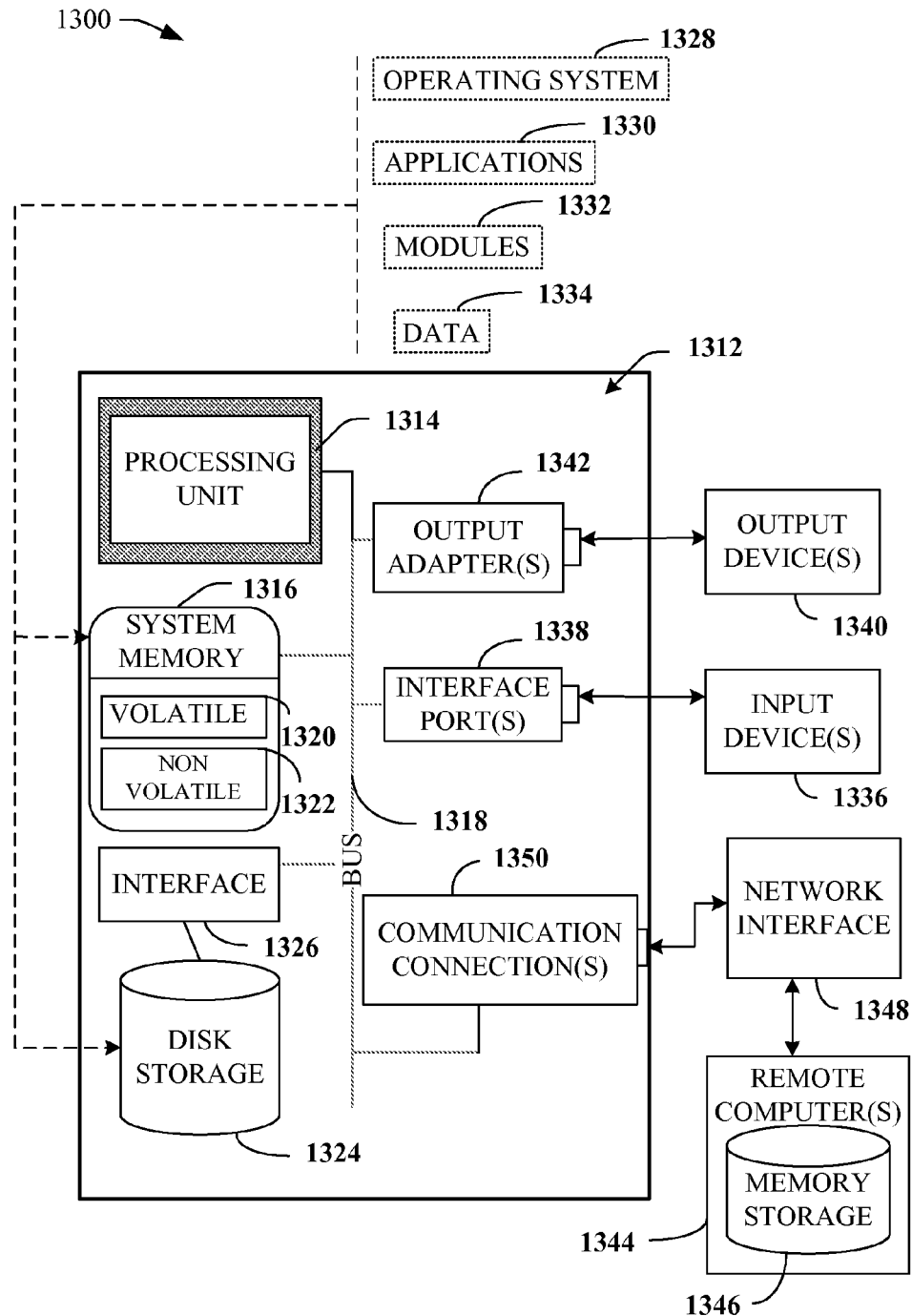
FIG. 13 is a schematic block diagram illustrating a suitable operating environment.
Figure 14:
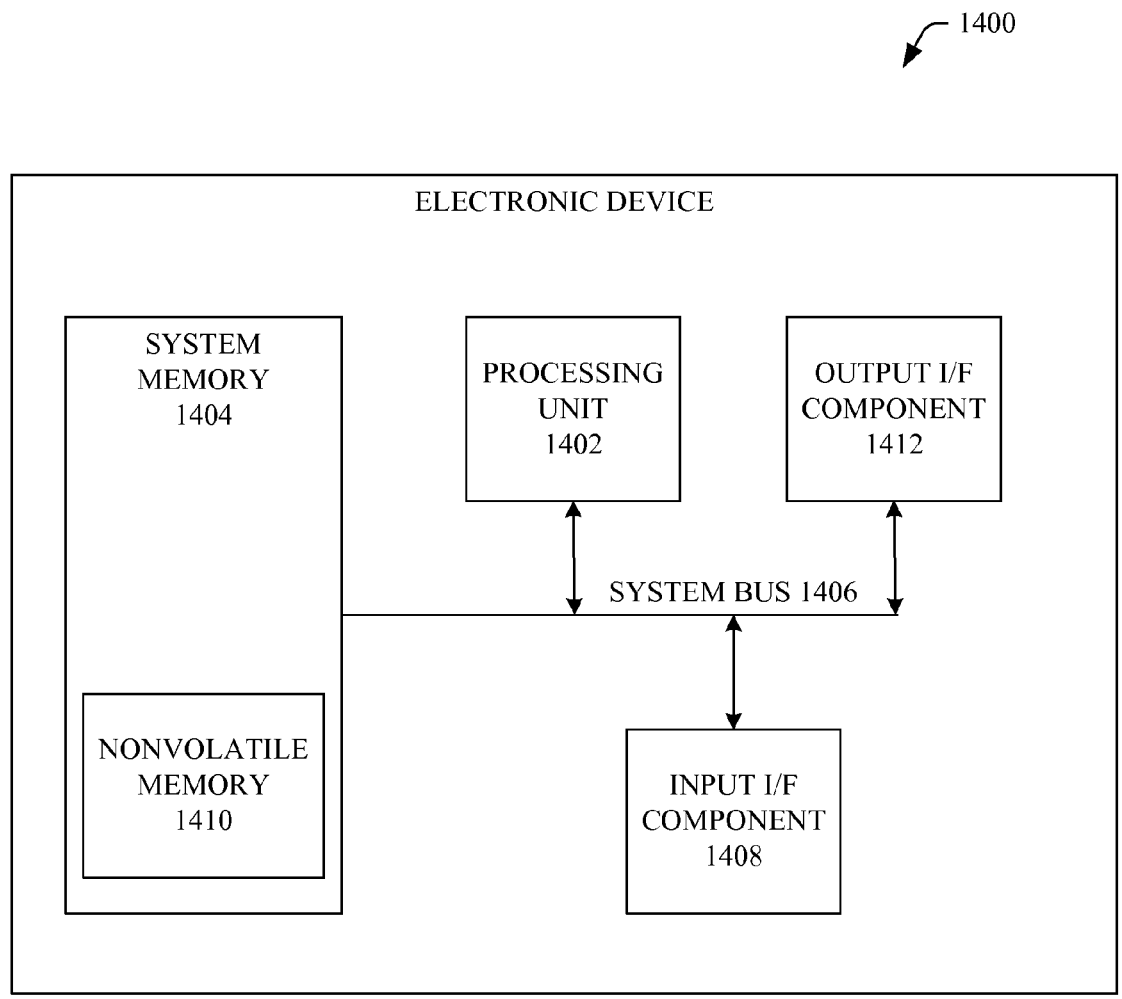
FIG. 14 is a block diagram of an exemplary electronic device that can utilize a memory device(s).

In order to provide a context for the various aspects of the disclosed subject matter, FIGS. 13 and 14 as well as the following discussion are intended to provide a brief, general description of a suitable environment in which the various aspects of the disclosed subject matter may be implemented. While the subject matter has been described above in the general context of computer-executable instructions of a computer program that runs on a computer and/or computers, those skilled in the art will recognize that the subject innovation also may be implemented in combination with other program modules. Generally, program modules include routines, programs, components, data structures, etc. that perform particular tasks and/or implement particular abstract data types. Moreover, those skilled in the art will appreciate that the inventive methods may be practiced with other computer system configurations, including single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on standalone computers. In a distributed computing environment, program modules may be located in both local and remote memory storage devices.

With reference to FIG. 13, a suitable environment 1300 for implementing various aspects of the claimed subject matter includes a computer 1312. The computer 1312 includes a processing unit 1314, a system memory 1316, and a system bus 1318. The system bus 1318 couples system components including, but not limited to, the system memory 1316 to the processing unit 1314. The processing unit 1314 can be any of various available processors. Dual microprocessors and other multiprocessor architectures also can be employed as the processing unit 1314.

The system bus 1318 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCM-CIA), Firewire (IEEE 1394), and Small Computer Systems Interface (SCSI).

The system memory 1316 includes volatile memory 1320 and nonvolatile memory 1322. The basic input/output system (BIOS), containing the basic routines to transfer information between elements within the computer 1312, such as during start-up, is stored in nonvolatile memory 1322. By way of illustration, and not limitation, nonvolatile memory 1322 can include ROM, PROM, EPROM, EEPROM, FeRAM, or flash memory. Volatile memory 1320 includes RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1312 also includes removable/non-removable, volatile/non-volatile computer storage media. FIG. 13 illustrates, for example, a disk storage 1324. Disk storage 1324 includes, but is not limited to, devices like a magnetic disk drive, floppy disk drive, tape drive, Jaz drive, Zip drive, LS-100 drive, flash memory card, or memory stick. In addition, disk storage 1324 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1324 to the system bus 1318, a removable or non-removable interface is typically used, such as interface 1326.

It is to be appreciated that FIG. 13 describes software that acts as an intermediary between users and the basic computer resources described in the suitable operating environment 1300. Such software includes an operating system 1328. Operating system 1328, which can be stored on disk storage 1324, acts to control and allocate resources of the computer system 1312. System applications 1330 take advantage of the management of resources by operating system 1328 through program modules 1332 and program data 1334 stored either in system memory 1316 or on disk storage 1324. It is to be appreciated that the disclosed subject matter can be implemented with various operating systems or combinations of operating systems.

A user enters commands or information into the computer 1312 through input device(s) 1336. Input devices 1336 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1314 through the system bus 1318 via interface port(s) 1338. Interface port(s) 1338 include, for example, a serial port, a parallel port, a game port, and a universal serial bus (USB). Output device(s) 1340 use some of the same type of ports as input device(s) 1336. Thus, for example, a USB port may be used to provide input to computer 1312, and to output information from computer 1312 to an output device 1340. Output adapter 1342 is provided to illustrate that there are some output devices 1340 like monitors, speakers, and printers, among other output devices 1340, which require special adapters. The output adapters 1342 include, by way of illustration and not limitation, video and sound cards that provide a means of connection between the output device 1340 and the system bus 1318. It should be noted that other devices and/or systems of devices provide both input and output capabilities such as remote computer(s) 1344.

Computer 1312 can operate in a networked environment using logical connections to one or more remote computers, such as remote computer(s) 1344. The remote computer(s) 1344 can be a personal computer, a server, a router, a network PC, a workstation, a microprocessor based appliance, a peer device or other common network node and the like, and typically includes many or all of the elements described relative to computer 1312. For purposes of brevity, only a memory storage device 1346 is illustrated with remote computer(s) 1344. Remote computer(s) 1344 is logically connected to computer 1312 through a network interface 1348 and then physically connected via communication connection 1350. Network interface 1348 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1350 refers to the hardware/software employed to connect the network interface 1348 to the bus 1318. While communication connection 1350 is shown for illustrative clarity inside computer 1312, it can also be external to computer 1312. The hardware/software necessary for connection to the network interface 1348 includes, for exemplary purposes only, internal and external technologies such as, modems including regular telephone grade modems, cable modems and DSL modems, ISDN adapters, and Ethernet cards.

Referring to FIG. 14, illustrated is a block diagram of an exemplary, non-limiting electronic device 1400 that can incorporate system 100, system 200, system 300, system 400, system 500, system 600, and/or system 700, or a portion(s) thereof. The electronic device can include, but is not limited to, network equipment (e.g. routers, access points), a media player and/or recorder (e.g., audio player and/or recorder, video player and/or recorder), a television, a smart card, a phone, a cellular phone, a smart phone, an electronic organizer, a PDA, a portable email reader, a laptop computers, a digital camera, an electronic device associated with digital rights management, a Personal Computer Memory Card International Association (PCMCIA) card, a trusted platform module (TPM), a Hardware Security Module (HSM), set-top boxes, a digital video recorder, a gaming console, a navigation system or device (e.g., global position satellite (GPS) system), secure memory devices with computational capabilities, devices with tamper-resistant chips, an electronic device associated with an industrial control system, an embedded computer in a machine (e.g., an airplane, a copier, a motor vehicle, a microwave oven), and the like.

Components of the electronic device 1400 can include, but are not limited to, a processing unit 1402, a system memory 1404 (with nonvolatile memory 1410), and a system bus 1406 that can couple various system components including the system memory 1404 to the processing unit 1402. The system bus 1406 can be any of several types of bus structures including a memory bus or memory controller, a peripheral bus, or a local bus using any of a variety of bus architectures.

Electronic device 1400 can typically include a variety of computer readable media. Computer readable media can be any available media that can be accessed by the electronic device 1400. By way of example, and not limitation, computer readable media can comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, nonvolatile memory 1410 or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by electronic device 1400. Communication media typically embodies computer readable instructions, data structures, program modules or other data in a modulated data signal such as a carrier wave or other transport mechanism and includes any information delivery media.

The system memory 1404 includes computer storage media in the form of volatile and/or nonvolatile memory such as nonvolatile memory 1410. A basic input/output system (BIOS), containing the basic routines that help to transfer information between elements within electronic device 1400, such as during start-up, can be stored in memory 1404. Memory 1404 typically also contains data and/or program modules that can be immediately accessible to and/or presently being operated on by processing unit 1402. By way of example, and not limitation, system memory 1404 can also include an operating system, application programs, other program modules, and program data.

The nonvolatile memory 1410 can be removable or non-removable. For example, the nonvolatile memory 1410 can be in the form of a removable memory card or a USB flash drive. In accordance with one aspect, the nonvolatile memory 1410 can include flash memory (e.g., single-bit flash memory, multi-bit flash memory), ROM, PROM, EPROM, EEPROM, or NVRAM (e.g., FeRAM), or a combination thereof, for example. Further, the flash memory can be comprised of NOR flash memory and/or NAND flash memory.

A user can enter commands and information into the electronic device 1400 through input devices (not shown) such as a keypad, microphone, tablet or touch screen although other input devices can also be utilized. These and other input devices can be connected to the processing unit 1402 through input interface component 1408 that can be connected to the system bus 1406. Other interface and bus structures, such as a parallel port, game port or a universal serial bus (USB) can also be utilized. A graphics subsystem (not shown) can also be connected to the system bus 1406. A display device (not shown) can be also connected to the system bus 1412 via an interface, such as output interface component 1412, which can in turn communicate with video memory. In addition to a display, the electronic device 1400 can also include other peripheral output devices such as speakers (not shown), which can be connected through output interface component 1412.

What has been described above includes examples of aspects of the disclosed subject matter. It is, of course, not possible to describe every conceivable combination of components or methodologies for purposes of describing the disclosed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has," or "having," or variations thereof, are used in either the detailed description or the claims, such terms are intended to be inclusive in a manner similar to the term "comprising" as "comprising" is interpreted when employed as a transitional word in a claim.

What is claimed is:

1. A system to program content to memory devices, comprising:

a plurality of memory devices associated with a plurality of memory modules, such that each memory device is contained in a respective memory module, and each memory device contain one or more memory locations in which content is stored, the plurality of memory modules are contained on a semiconductor;

a wafer program component that programs respective subsets of end-user content to each of the plurality of memory devices, wherein the respective subsets of content:

are based on predetermined criteria pertaining to at least one of an electronic device, a user, or an entity, or a combination thereof;

are programmed to the respective memory devices in parallel at substantially the same time; and are retained on respective memory devices such that when the semiconductor wafer is diced, the respective memory devices are implanted in an electronic device without further programming of end-user content for the specific electronic device; and a cutting component that dices the wafer into a plurality of integrated circuits such that, each integrated circuit contains at least one memory device of the plurality of memory devices.

2. The system of claim 1, the wafer program component programs one of the same subset of content or a different subsets of content to each memory device of the plurality of memory devices based on the predetermined criteria.

3. The system of claim 1, the wafer program component is implemented by one or more computers.

4. The system of claim 1, further comprising:

an interface that electrically connects the wafer program component to the plurality of memory devices on the semiconductor wafer to facilitate a program of the respective subsets of content to the memory devices.

5. The system of claim 1, further comprising at least one authentication component, at least one memory device of the plurality of the memory devices comprising the at least one authentication component that facilitates restriction of access to at least one piece of content, where access to the at least one piece of content is granted upon presentation of authentication credentials associated with the at least one piece of content to the at least one authentication component, the at least one piece of content is associated with at least one of a subscription, a user, or an entity, or a combination thereof.

6. The system of claim 5, further comprising:

a host processor that facilitates execution of operations on data; and a cryptographic component that facilitates at least one of encryption or decryption of the data, at least one of a memory device of the plurality of memory devices, the host processor, the authentication component, the cryptographic component, or a combination thereof, are contained on a single integrated circuit chip.

7. The system of claim 1, further comprising an intelligent component that can infer at least one automated function to be performed by the wafer program component.

8. The system of claim 1, the plurality of memory devices is comprised of at least one nonvolatile memory, the nonvolatile memory is at least one of read-only memory (ROM), flash memory, mask-programmed ROM, programmable ROM (PROM), Erasable PROM (EPROM), UV-erase EPROM, one-time programmable ROM, electrically erasable PROM (EEPROM), or nonvolatile random access memory, or a combination thereof, the nonvolatile random access memory comprising ferroelectric random access memory.

9. The system of claim 1, a memory device of the plurality of memory devices is associated with an electronic device, wherein the electronic device is one of a computer, a cellular phone, a digital phone, a video device, a smart card, a personal digital assistant, a television, an electronic game, a digital camera, an electronic organizer, an audio player, an audio recorder, an electronic device associated with digital rights management, a Personal Computer Memory Card International Association (PCMCIA) card, a trusted platform module (TPM), a Hardware Security Module (HSM), a navigation device, set-top boxes, a secure memory device with computational capabilities, an electronic device with a tamper-resistant chip, an electronic device associated with an industrial control system, or an embedded computer in a machine, wherein the machine comprises one of an airplane, a copier, a motor vehicle, or a microwave oven.

10. The system of claim 1, further comprising a plurality of memory stamps, each associated with a respective subset of end-user content, that are selectively retrieved by the wafer program component to simultaneously program the plurality of memory devices.

11. The system of claim 1, wherein the programmed content is an operating system.

12. A method that facilitates programming data into a plurality of memory devices associated with a plurality of memory modules, such that each memory device is contained in a respective memory module, and each memory device contains one or more memory locations in which content is stored, the plurality of memory modules are contained on a semiconductor, comprising:
determining at least one subset of end-user data based on at least one of an electronic device, a user, or an entity, or a combination thereof;
programming in parallel the at least one subset of end-user data to each respective memory device of the plurality of memory devices contained on a wafer at substantially the same time; and
dicing the wafer after programming such that the respective memory devices store the at least one subset of end-user data and the respective memory devices are without need for further programming of end-user data when implanted in an electronic device.

13. The method of claim 12, further comprising:
creating a database;
storing data in the database; and
retrieving the subset of end-user data from the database.

14. The method of claim 12, further comprising:
determining if each memory device of the plurality of memory devices is to be programmed with a same subset of end-user data or disparate subsets end-user of data;
at least one of:
retrieving the same subset of end-user data if each memory device is to be programmed with the same subset of end-user data, or
retrieving disparate subsets of end-user data if each memory device is to be programmed with disparate subsets of end-user data; and
at least one of:
programming the same subset of end-user data to each memory device if each memory device is to be programmed with the same subset of end-user data, or
programming the disparate subsets of end-user data to respective memory devices if the respective memory devices are to be programmed with respective disparate subsets of end-user data.

15. The method of claim 12, further comprising:
determining if at least one piece of data of the at least one subset of end-user data is restricted such that authentication information associated with the at least one piece of data is to be presented in order for access to the at least one piece of data is granted;
determining at least one of a type of authentication information or a level of authentication information, or a combination thereof, to be presented in order for access to the at least one piece of data is granted, if it is determined that authentication information is to be presented to access the at least one piece of data; and
programming the subset of end-user data to at least one memory device of the plurality of memory devices, the at least one piece of data is programmed with access restricted if it is determined that authentication information is to be presented to access the at least one piece of data.

16. The method of claim 12, further comprising retrieving at least one memory stamp that corresponds to the at least one subset of end-user data to simultaneously program the plurality of memory devices.

17. A system for programming content to memory devices associated with a plurality of memory modules, such that each memory device is contained in a respective memory module, and each memory device contains one or more memory locations in which content is stored, the plurality of memory modules are contained on a wafer, comprising:
means for determining a subset of end-user content based on predefined criteria; and
means for programming the subset of end-user content substantially simultaneously to a plurality of memory devices contained on the wafer such that the plurality of memory devices retain the respective subsets of end-user content after dicing such that the respective memory devices are without need for further programming of end-user content for when implanted in an electronic device.

18. The system of claim 17, further comprising:
means for generating a content database;
means for storing the content database;
means for obtaining the subset of end-user content from the means for storing the content database;
means for cutting the wafer into a plurality of dies, each die of the plurality of dies contains a memory device wherein respective memory devices contain end-user programs and are implantable into an electronic device.

19. The system of claim 17, further comprising:
means for restricting rights to access a portion of the subset end-user of data;
means for granting access rights to access the portion of the subset end-user of data;
means for compressing the subset of end-user data;
means for decompressing the subset of end-user data; and
means for displaying data.

* * * * *